(12) United States Patent
Fukuda

(10) Patent No.: US 8,686,432 B2
(45) Date of Patent: Apr. 1, 2014

(54) SEMICONDUCTOR LIGHT EMITTING DEVICE WITH LASER SCRIBED END FACES

(75) Inventor: Kazuhisa Fukuda, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/537,564

(22) Filed: Jun. 29, 2012

(65) Prior Publication Data

US 2013/0001588 A1 Jan. 3, 2013

(30) Foreign Application Priority Data

Jun. 30, 2011 (JP) ................................. 2011-145864

(51) Int. Cl.
*H01L 29/15* (2006.01)

(52) U.S. Cl.
USPC ............................................................ 257/76

(58) Field of Classification Search
USPC ............................................................ 257/76
See application file for complete search history.

(56) References Cited

U.S. PATENT DOCUMENTS

| 2007/0121692 A1* | 5/2007 | Kawakami et al. | 372/43.01 |
| 2008/0166852 A1* | 7/2008 | Kamikawa | 438/421 |
| 2009/0022191 A1* | 1/2009 | Masui | 372/43.01 |

FOREIGN PATENT DOCUMENTS

| JP | 2008-135785 A | 6/2008 |
| JP | 2010-123869 A | 6/2010 |

* cited by examiner

*Primary Examiner* — Anthony Ho
(74) *Attorney, Agent, or Firm* — Sughrue Mion, PLLC

(57) ABSTRACT

A semiconductor device composed of a Group III nitride semiconductor has the following structure. A substrate has on it an n-type first semiconductor layer, an active layer, and a p-type second semiconductor layer in this order. Two first end faces are formed by cleavage and oppose each other in planar view. Two trenches extend to the two first end faces in the direction orthogonal to the first end faces in planar view. Bottoms of the trenches are positioned at least below the lower surface of the active layer. Second end faces are formed by laser scribing in the direction orthogonal to the first end faces and outside the trenches.

14 Claims, 23 Drawing Sheets

SEMICONDUCTOR LIGHT EMITTING DEVICE WITH LASER SCRIBED END FACES

This application is based on Japanese patent application No. 2011-145864, the content of which is incorporated hereinto by reference.

BACKGROUND

1. Technical Field

The present invention relates to a semiconductor light emitting device and a method of manufacturing a semiconductor light emitting device.

2. Related Art

In recent years, there have been many proposals to suppress the defects caused by break of elements, particularly in semiconductor devices composed of a Group III nitride semiconductor.

Japanese Laid-Open Patent Publication No. 2008-135785 (JP-A-2008-135785) describes a method of manufacturing a nitride semiconductor device as follows. First, trenches are formed on the surface of a semiconductor wafer, typically using a dicer. Next, break lines are formed by forming a work-affected layer inside the semiconductor wafer below the trenches. The semiconductor wafer is then broken along the break lines. According to JPA-2008-135785, such a method would enable to form highly accurate break lines in narrower and deeper trenches with little variation in working, without degrading accuracy of working typically due to wear of cutting edge of the dicer.

Japanese Laid-Open Patent Publication No. 2010-123869 (JP-A-2010-123869) describes a nitride semiconductor laser device. An n-type cladding layer, an n-type optical guide layer, an active layer, an electron barrier layer, a current blocking layer, a p-type optical guide layer, and a p-type cladding layer are sequentially formed on a substrate. The current blocking layer has a first opening that serves as a current injection portion, and second openings that serve as current blocking portions. First recesses are formed in a region positioned outside the second openings as viewed from the first opening, and the first recesses extend through the electron barrier layer. In addition, second recesses are formed in regions between the first opening and the second openings, and bottoms of the second recesses are positioned above the lower surfaces of the electron barrier layer. In the description, the first recesses are trenches used for element isolation, and the laser chips may be split by scribing. In this way, current leakage ascribable to the first recesses for element isolation may be prevented, and variation in threshold for laser oscillation may be suppressed even if the first recesses have a large depth, according to JP-A-2010-123869.

SUMMARY

In a process of manufacturing a semiconductor device composed of a nitride semiconductor, the laser scribing for breaking the substrate may cause a problem e.g. current leakage through a melted portion locally produced along the break line in the semiconductor device. The inventors, however, found out that the problem was not successfully solved even if the break lines were formed at the bottoms of the trenches for element isolation by laser scribing shown as the two above-described patent documents.

According to the present invention, there is provided a semiconductor light emitting device composed of a Group III nitride semiconductor, comprising:

a substrate;

a first conductivity-type first semiconductor layer provided above the substrate;

an active layer provided over the first semiconductor layer;

a second conductivity-type second semiconductor layer provided over the active layer;

two first end faces formed by cleavage and opposite each other in planar view;

two trenches extending to the two first end faces in a direction orthogonal to the first end faces in planar view, wherein bottoms of the trenches are positioned at least below a lower surface of the active layer; and second end faces formed in the direction orthogonal to the first end faces and outside the trenches, the second end faces being formed by laser scribing.

According to the present invention, there is also provided a method of manufacturing a semiconductor light emitting device composed of a Group III nitride semiconductor, the method comprising:

forming a first conductivity-type first semiconductor layer above a substrate;

forming an active layer over the first semiconductor layer;

forming a second conductivity-type second semiconductor layer over the active layer;

forming two trenches extending in a direction orthogonal to two cleavage lines in planar view, wherein bottoms of the trenches are positioned at least below the lower surface of the active layer;

forming first end faces by cleavage along the two cleavage lines, the first end faces being opposite each other in planar view; and forming second end faces in a direction orthogonal to the first end faces and in regions between the two adjacent trenches, the second end faces being formed by laser scribing.

According to the present invention, the two trenches extend to the two first end faces in the direction orthogonal to the first end faces in planar view. The bottoms of the trench are positioned at least below the lower surface of the active layer. In addition, the second end faces are formed by laser scribing in the direction orthogonal to the first end faces and outside the trenches. In such a configuration, the laser scribing is prevented from causing a problem such as current leakage.

Accordingly, the present invention may provide a semiconductor light emitting device having a desired geometry without causing any defects ascribable to laser scribing.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1:
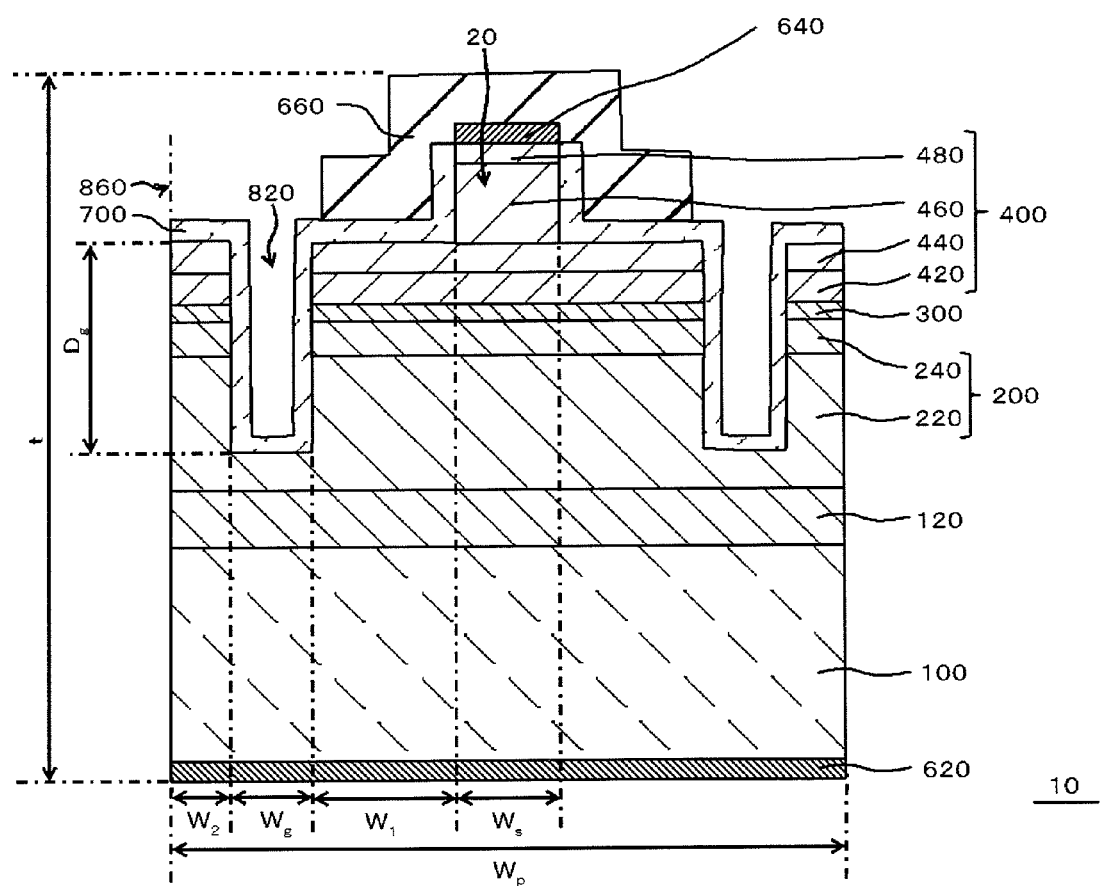
FIG. 1 is a cross sectional view illustrating a configuration of a semiconductor light emitting device of a first embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Embodiments of the present invention will be explained below, referring to the attached drawings. Note that, in all drawings, any similar constituents will be given similar reference numerals, so as to avoid repetitive explanations. The embodiments below will deal with the case where the first conductivity type denotes n type, and the second conductivity type denotes p type, merely for exemplary purposes, allowing exchange of the conductivity type vice versa.

(First Embodiment)

Figure 2:
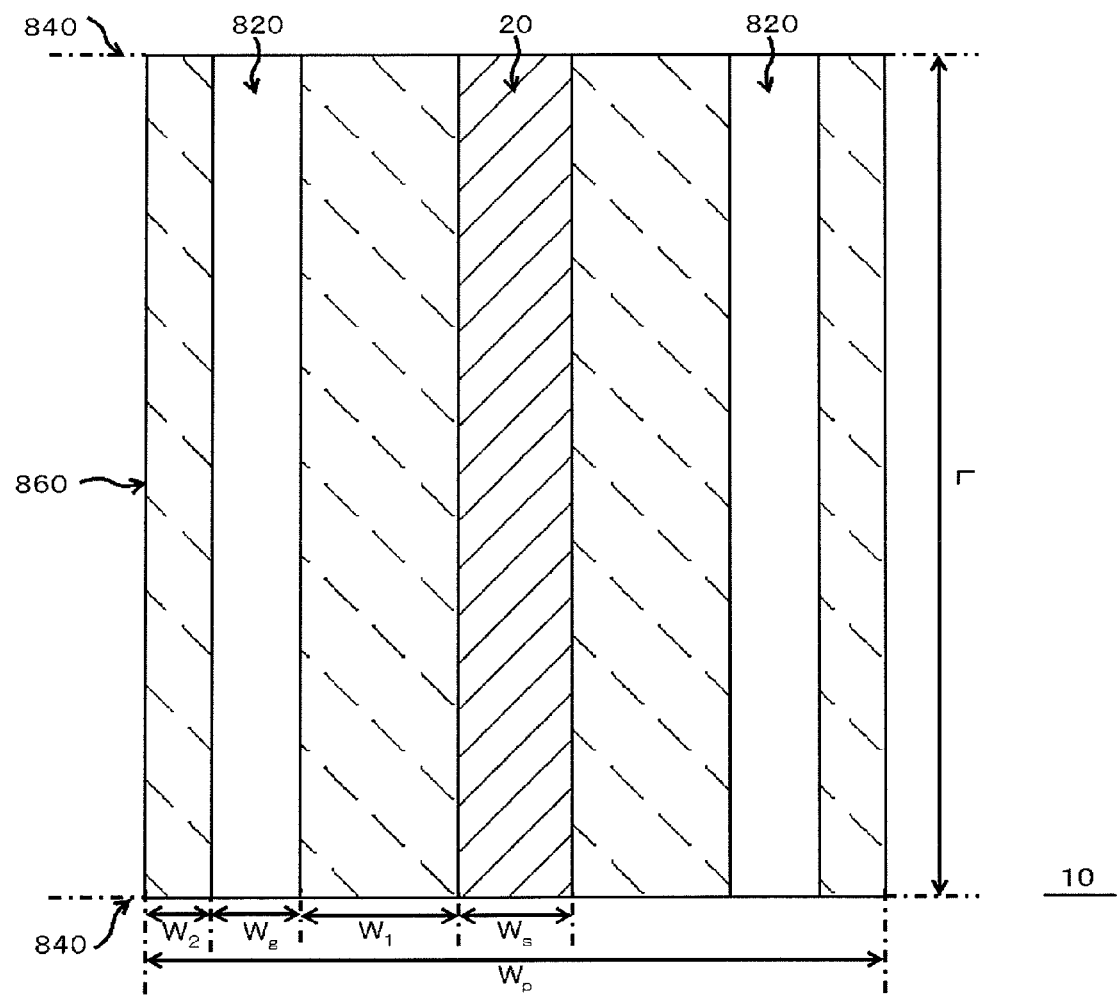
FIG. 2 is a plan view illustrating a configuration of a semiconductor light emitting device of the first embodiment.

A semiconductor device 10 of the first embodiment will be explained referring to FIG. 1 and FIG. 2. FIG. 1 is a cross sectional view illustrating a configuration of the semiconductor light emitting device 10 of the first embodiment. FIG. 2 is a plan view illustrating a configuration of the semiconductor light emitting device 10 of the first embodiment. The semiconductor device 10 composed of a Group III nitride semiconductor has a configuration as described below. A substrate 100 has above it an n-type first semiconductor layer 200, an active layer 300, and a p-type second semiconductor layer 400 in this order. Two first end faces 840 are formed by cleavage and oppose each other in planar view. Two trenches 820 extend to the two first end faces 840 in the direction orthogonal to the first end faces 840. The bottoms of the trenches 820 extend at least below the lower surface of the active layer 300. Second end faces 860 are formed in the direction orthogonal to the first end faces 840 and outside the trenches 820. The second end faces 860 are formed by laser scribing. Details will be given below.

The "semiconductor light emitting device 10" in the context herein is defined to contain both of light emitting diode (LED) and laser diode (LD). In the first embodiment, the "semiconductor light emitting device 10" is typically an LD.

FIG. 1 is a drawing of the semiconductor light emitting device 10 viewed from one of the first end faces 840 formed by cleavage. As seen in FIG. 1, the semiconductor light emitting device 10 has the substrate 100. The substrate 100 is a single crystalline substrate on which a Group III nitride semiconductor is epitaxially grown. More specifically, the substrate 100 is an n-type GaN substrate, for example. The substrate 100 is polished in the process of manufacturing of the semiconductor light emitting device 10.

A Si-doped, for example, n-type GaN layer 120 is provided over the substrate 100. The n-type GaN layer 120 functions as a buffer layer in the succeeding process of epitaxial growth. The n-type GaN layer 120 is typically 1 µm thick. Note that the n-type GaN layer 120 is omissible.

The n-type first semiconductor layer 200 is provided over the n-type GaN layer 120. The first semiconductor layer 200 may be configured by a single layer, or by a plurality of layers. In the illustrated example, the first semiconductor layer 200 has an n-type first cladding layer 220 provided over the n-type GaN layer 120, and an n-type first optical confinement layer 240 provided over the first cladding layer 220.

The first cladding layer 220 is typically an n-type $Al_{0.1}Ga_{0.9}N$ layer. The thickness of the first cladding layer 220 is typically 2 µm. The first optical confinement layer 240 is typically a Si-doped, n-type GaN layer. The thickness of the first optical confinement layer 240 is typically 0.1 µm.

The active layer 300 is provided over the first semiconductor layer 200. The active layer 300 has a multiple quantum well (MQW) structure. More specifically, the active layer 300 typically has a MQW structure in which a well layer composed of $In_{0.15}Ga_{0.85}N$ (3 nm thick) and a barrier layer composed of Si-doped $In_{0.01}Ga_{0.99}N$ (4 nm thick) are repeated three times.

A p-type second semiconductor layer 400 is provided over the active layer 300. The second semiconductor layer 400 may be configured by a single layer, or by a plurality of layers. The second semiconductor layer 400 exemplified herein has a p-type cap layer 420 provided over the active layer 300, a p-type second optical confinement layer 440 provided over the cap layer 420, a p-type second cladding layer 460 provided over the second optical confinement layer 440, and a p-type contact layer 480 provided over the second cladding layer 460.

The cap layer 420 is typically a Mg-doped, p-type $Al_{0.2}Ga_{0.8}N$ layer. The thickness of the cap layer 420 is typically 10 nm. The second optical confinement layer 440 is typically a Mg-doped, p-type GaN layer. The thickness of the second optical confinement layer 440 is typically 0.1 µm. The second cladding layer 460 is typically a p-type $Al_{0.1}Ga_{0.9}N$ layer. The thickness of the second cladding layer 460 is typically 0.5 µm. The contact layer 480 is typically a Mg-doped, p-type GaN layer. The thickness of the contact layer 480 is typically 20 nm.

The second cladding layer 460 and the contact layer 480 are formed in a pattern of striped ridge 20. By virtue of this configuration, electric current may be concentrated within the width ($W_s$) of the ridge 20.

The two trenches 820 are formed, in planar view, outside the ridge 20 that contains the second cladding layer 460. The bottoms of the trenches 820 are positioned at least below the lower surface of the active layer 300. Thus, it is possible to suppress defects such as current leakage caused by laser scribing. Effects of the trenches 820 will be detailed later.

It suffices to dispose the bottoms (reference numeral not given) of the trenches 820 at least below the lower surface of the active layer 300, and the bottoms may be positioned at a deeper position. If the bottoms of the trenches 820 are positioned below the active layer 300, it is possible to reliably suppress characteristic degradation due to heat damage cased by laser scribing, or current leakage through the melted portion.

Nevertheless, it is technically difficult to dispose the bottoms of the trenches 820 in the first optical confinement layer 240 because the first optical confinement layer 240 is generally thin. It is undesirable that the bottoms of the trenches 820 reaches the substrate 100, because crystal defects may tends to occur at the interface between the substrate 100 and the epitaxially grown layer (the n-type GaN layer 120, in this example). Accordingly, the bottoms of the trenches 820 are preferably provided within the range of the first cladding layer 220. In this way, the trenches 820 are formed to prevent defects such as current leakage from occurring.

For the depth $D_g$ of the trenches 820 measured from the opening edge (reference numeral not given) to the bottom, and the total thickness t of the semiconductor light emitting device 10, the depth $D_g$ is typically not larger than 10% of the total thickness t. The "total thickness t" herein means the thickness measured from the bottom surface to the top surface of the semiconductor light emitting device 10 after the polishing process described later. The total thickness t means, therefore, the thickness measured from the lower surface of a first electrode 620 to the top surface of a cover electrode 660, described later. If the depth $D_g$ of the trenches 820 falls within the above-described range, defects caused by cleavage or break may be prevented from propagating along the first side faces (822, described later) of the trenches 820.

There is no limitation on cross sectional geometry of the trenches 820. The cross sectional geometry of the trenches 820 may be appropriately formed in a preferred shape. More specifically, the cross sectional geometry of the trenches 820 is rectangle, for example. Other geometry of the trenches 820 include inverted triangle, with the bottom edge assumed as the opening edge. The cross sectional geometry of the trenches 820 may alternatively an inverted trapezoid, with the bottom edge assumed as the opening edge.

The second end faces 860 are formed outside the trenches 820 by laser scribing. Accordingly, the melted portion (not illustrated) where the semiconductor is melted by laser is formed on the second end faces 860. Metal derived from the semiconductor material adheres to the melted portion. Accordingly, there is a possibility to cause short circuit between the semiconductor layers having different conductivity type through such a melted portion.

A protective layer 700 is provided over the second semiconductor layer 400, and contacts with the inner surfaces of the trenches 820. The protective layer 700 has an opening allowing exposure of a part of the second semiconductor layer 400. The opening is formed in a region between the two trenches 820 in planar view. The "opening allowing exposure of a part of the second semiconductor layer 400" means the opening formed on the top surface of the contact layer 480 contained in the second semiconductor layer 400.

The protective layer 700 is preferably composed of a material not causative of oxidation of the surface of the semiconductor light emitting device 10. More specifically, the protective layer 700 is a $SiO_2$ layer, for example.

A second electrode 640 is formed in the opening of the protective layer 700. The second electrode 640 is formed using a material capable of establishing ohmic contact with the p-type GaN layer. More specifically, the second electrode 640 is composed of Pd/Pt.

The second electrode 640 preferably does not connect to the first side faces (822, described later) of the trenches 820. It is particularly preferable that the second electrode 640 is not formed on the first end faces 840 that serve as a light emitting surface. In such a configuration, a structure having an injection-free region near the laser facet is attainable, and the critical light output may be improved on the end face.

The total thickness t of the semiconductor light emitting device 10 is preferably 80% or smaller than the distance, in planar view, between the two first end faces 840 (oscillator length L, described later). The total thickness t of the semiconductor light emitting device 10 is also preferably 80% or smaller than the distance, in planar view, between the two second end faces 860 (device width $W_p$, described later). On the other hand, the lower limit value of the total thickness t of the semiconductor light emitting device 10 is not specifically limited, so long as the rigidity may be ensured at a level sufficient for avoiding defects such as wafer cracks.

More specifically, the device width $W_p$ is 90 μm or larger and 1000 μm or smaller. The total thickness t of the semiconductor light emitting device 10 is therefore 50 μm or larger and 150 μm or smaller. The total thickness t of the semiconductor light emitting device 10 is preferably 70 μm or larger and 120 μm or smaller. If the total thickness t of the semiconductor light emitting device 10 falls within the above described ranges, the first end faces 840 and the second end faces 860 may be produced in a stable manner in the manufacturing process. In addition, the rigidity of the semiconductor light emitting device 10 may be kept at a desirable level.

A cover electrode 660 is formed over the second electrode 640. A bonding wire (not illustrated) is connected directly on the cover electrode 660. In this way, the semiconductor light emitting device 10 may be mounted on some other substrate (not illustrated) or the like. The cover electrode 660 is typically composed of a multi-layered structure of Ti/Pt/Au stacked in this order over the second electrode 640. A bonding pad (not illustrated) may be formed between the cover electrode 660 and the bonding wire (not illustrated), typically by Au plating.

The substrate 100 is polished on its back surface opposite to the surface on which the first semiconductor layer 200 and so forth are formed. The first electrode 620 is formed over the back surface of the substrate 100. The first electrode 620 is formed using a material capable of establishing ohmic contact with the n-type GaN layer. If the substrate 100 is a GaN substrate, the first electrode 620 typically has a multi-layered structure of Ti/Al/Ti/Au stacked in this order over the substrate 100.

The cover electrode 660 may be connected typically to a lead terminal (not illustrated) through a bonding wire (680). In addition, a lidded cylindrical cap may be provided to cover the semiconductor light emitting device 10, and allows a passage of light from the semiconductor light emitting device 10.

Next, a configuration of the semiconductor light emitting device 10, in planar view, will be explained referring to FIG. 2. FIG. 2 is a top view of the semiconductor device 10. Note that the hatching in FIG. 2 is given for the convenience of recognition but is not correlated to the hatching in FIG. 1.

Assume that $W_p$ is the distance between the two second end faces 860 (the width of the semiconductor light emitting device 10), $W_s$ is the width of the ridge 20 that contains the second cladding layer 460, $W_1$ is the distance between the trench 820 and the ridge 20 that contains the second cladding layer 460, $W_g$ is the width of the trench 820, $W_2$ is the distance between the trench 820 and the second end face 860, and L is the distance between the two first end faces 840 (resonator length).

As illustrated in FIG. 2, the two first end faces 840 are formed by cleavage and oppose each other in planar view. The "cleavage" in this context means splitting of crystal in a direction along which the crystal is likely to generate a crack among various specific directions. The term "cleavage plane" in the description below means a crystal plane formed by the cleavage, and serves as a resonator plane of laser. For an exemplary case where the substrate 100 is a (0001) GaN substrate, the direction of cleavage lies in the <11-20> direction.

The distance (resonator length) L between the two first end faces 840 is the resonator length of laser. The distance (resonator length) L between the two first end faces 840 is determined based on oscillation wavelength of laser, refractive index of the active layer 300, and application. More specifically, the resonator length L is 800 μm.

The two trenches 820 extend in the direction orthogonal to the first end faces 840 in planar view, up to the two first end faces 840. The "direction orthogonal to the first end faces 840" herein is same as the direction orthogonal to the cleavage plane. For an exemplary case where the substrate 100 is a (0001) GaN substrate, and the direction of cleavage lies in the <11-20> direction, the "direction orthogonal to the first end faces 840" herein lies in the <1-100> direction.

An emission area of the semiconductor light emitting device 10 is formed in the region between the two trenches 820 in planar view. The "emission area" herein means an area where holes injected from the first semiconductor layer 200 side and electrons injected from the second semiconductor layer 400 side recombine to produce light.

The second cladding layer 460 and the contact layer 480 are formed in the region between the two trenches 820 in planar view. The second cladding layer 460 is formed in a pattern of the striped ridge 20 and extends up to the first end faces 840. The emission area in this embodiment in planar view is, therefore, determined based on the width $W_s$ of the ridge 20.

As described in the above, the two trenches 820 extend up to the two first end faces 840. In other words, the two trenches 820 are continuously formed up to the two first end faces 840. Accordingly, the thermal damage possibly caused in the second end face forming process will no longer propagate from the second end faces 860 to the emission area.

The distance $W_1$ between the trench 820 and the ridge 20 that contains the second cladding layer 460 is not smaller than the width $W_s$ of the ridge 20 that contains the second cladding layer. If the $W_1$ is smaller than the width $W_s$ of the ridge 20, the emission area in planar view may adversely be affected. In the first embodiment, an optical confinement effect particularly in the transverse direction may adversely be affected. If the distance $W_1$ is not smaller than the width $W_s$ of the ridge 20, the emission area may be formed in a stable manner.

The distance $W_2$ between the trench 820 and the second end face 860 is adjusted to 20% or larger of the distance $W_p$ between the two second end faces 860. In other words, the distance $W_2$ between the trench 820 and the second end face 860 may be expressed as $W_2 \geq 0.2 W_p$, using the distance $W_p$ between the two second end faces 860. More specifically, the distance $W_2$ is typically 5 μm or larger. In this way, the laser scribing may be proceeded with a good yield.

The width $W_g$ of the trench 820 may be expressed, using $W_p$, $W_s$, $W_1$ and $W_2$, by the equation (1).

[Mathematical Formula 1]

$$W_g = \frac{W_p - W_s}{2} - W_1 - W_2 \tag{1}$$

Since $W_1 \geq W_s$ and $W_2 \geq 0.2 W_p$ as is understood from the above, the width $W_g$ of the trench 820 satisfies the equation (2) below.

[Mathematical Formula 2]

$$W_g \leq 0.3 W_p - 1.5 W_s \tag{2}$$

Under these conditions, the emission area will not adversely be affected, and the thermal damage possibly induced in the second end face forming process will no longer propagate from the second end faces 860 to the emission area.

On the other hand, the width $W_g$ of the trench 820 is typically 1 μm or larger. If the width $W_g$ of the trench 820 is not smaller than such a lower limit value, the trench 820 may be formed in a stable manner. Moreover, if the width $W_g$ of the trench 820 is not smaller than the lower limit value, the thermal damage will no longer propagate to the emission area in the second end face forming process.

An anti-reflecting (AR) film may be formed on one of the first end faces 840. A high-reflecting (HR) film may be formed on the other first end face 840. More specifically, the anti-reflecting film is typically an $Al_2O_3$ film, and the high-reflecting film is typically a multi-layered film composed of $SiO_2$ and $ZrO_2$.

(Method of Manufacturing)

Figure 13:
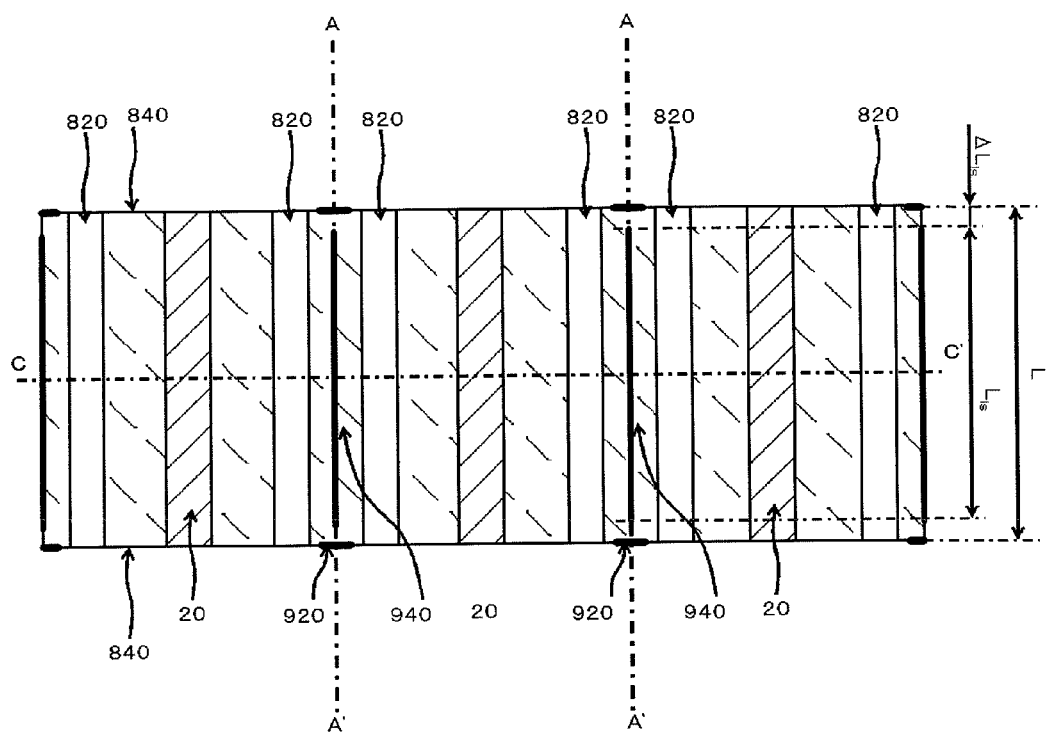
Figure 14:
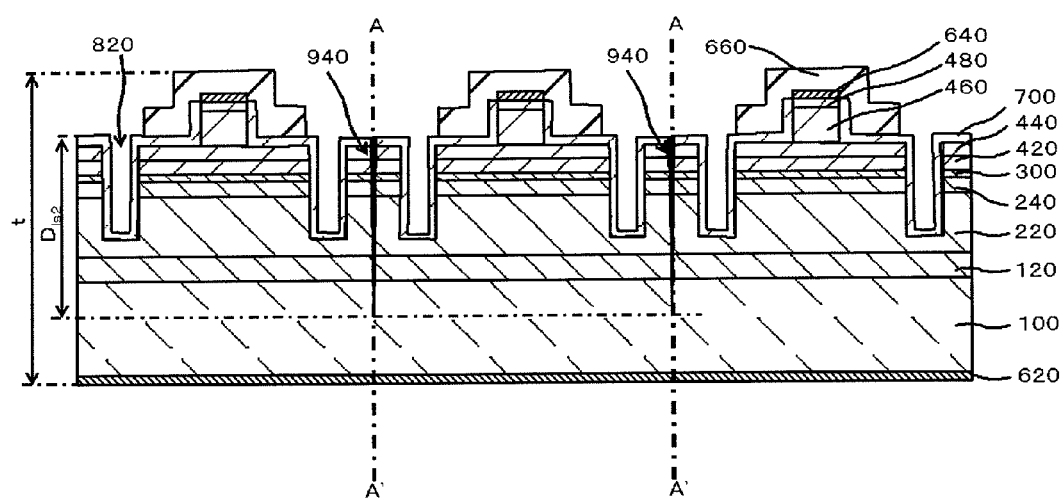
FIG. 14 is a cross sectional view explaining the method of manufacturing a semiconductor light emitting device of the first embodiment.

Next, a method of manufacturing of the semiconductor light emitting device 10 of the first embodiment will be explained referring to FIGS. 3 to 15. FIGS. 3 to 12 and FIGS. 15A to 15D are cross sectional views for explaining a method of manufacturing of the semiconductor light emitting device 10 of the first embodiment. FIG. 13 and FIG. 14 are plan views for explaining the method of manufacturing of the semiconductor light emitting device 10 of the first embodiment.

The method of manufacturing of the semiconductor light emitting device 10 composed of a Group III nitride semiconductor according to the first embodiment has steps below. First, the n-type first semiconductor layer 200 is formed over the substrate 100 (first semiconductor layer forming process). Next, the active layer 300 is formed over the first semiconductor layer 200 (active layer forming process). Next, the p-type second semiconductor layer 400 is formed over the active layer 300 (second semiconductor layer forming process). Next, the two trenches 820 are formed in the direction, in planar view, orthogonal to the cleavage lines. In forming the trenches 820, the bottoms of the two trenches 820 are positioned below at least the lower surface of the active layer 300. Next, the first end faces 840 are formed by cleavage at the two cleavage lines and oppose each other in planar view (first end face forming process). Next, the second end faces 860 are formed in the direction orthogonal to the first end faces 840 and outside the trenches 820, by laser scribing (second end face forming process). Details will be given below.

The method of manufacturing of the semiconductor light emitting device 10 explained below is typically proceeded by metal-organic vapor phase epitaxy (MOVPE), and is preferably proceeded in a chamber of an MOVPE apparatus under a reduced pressure. The pressure of the chamber is typically set to 300 hPa.

Carrier gas used for MOVPE is $H_2$ (hydrogen) or $N_2$ (nitrogen). Group III element sources used for forming the individual Group III nitride semiconductor layers include trimethylgallium (TMG) as a Ga gource, trimethylaluminum (TMA) as an Al source, and trimethylindium (TMI) as an In source, for example. Examples of source of n-type dopant include silane ($SiH_4$). Examples of source of p-type dopant include bis(cyclopentadienyl)magnesium ($Cp_2Mg$).

Figure 3:
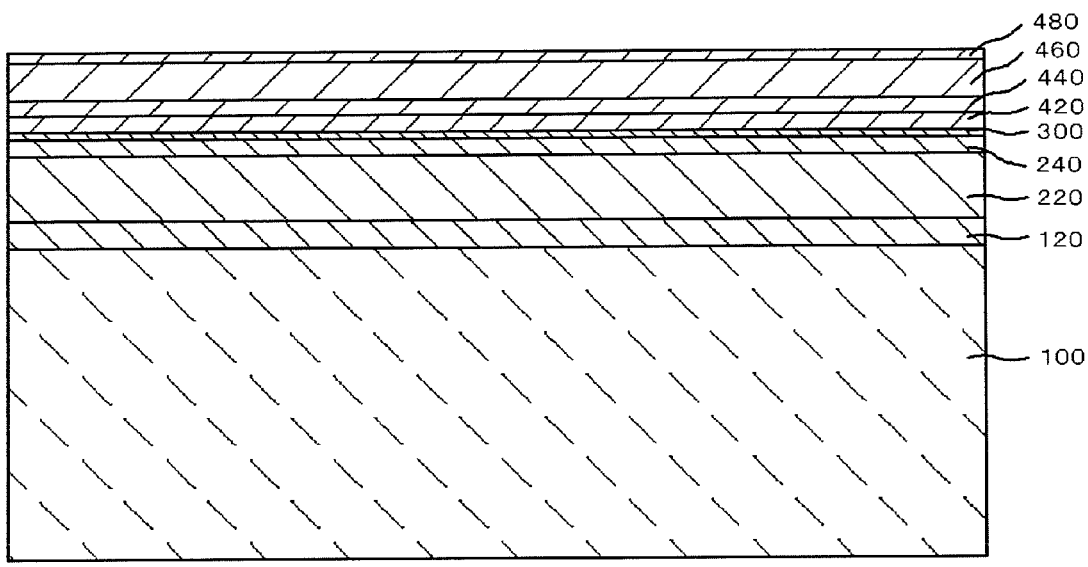
FIGS. 3 to 11 are cross sectional views explaining a method of manufacturing a semiconductor light emitting device of the first embodiment.

The substrate 100 is placed in an MOVPE apparatus, and the individual layers are epitaxially grown, as illustrated in FIG. 3. First, the Si-doped, n-type GaN layer 120 is epitaxially grown over the substrate 100.

Next, the n-type first semiconductor layer 200 is grown over the n-type GaN layer 120 (first semiconductor layer forming process). In the first semiconductor layer forming process, first, the p-type first cladding layer 220 is formed over the substrate 100. The n-type first cladding layer 220 grown herein is typically an n-type $Al_{0.1}Ga_{0.9}N$ layer. Next, the p-type first optical confinement layer 240 is formed over the first cladding layer 220. The n-type first optical confinement layer grown herein is typically a Si-doped, n-type GaN layer.

Next, the active layer 300 is formed over the first semiconductor layer 200. More specifically, the active layer 300 grown herein has a MQW structure typically in which a well layer composed of $In_{0.15}Ga_{0.85}N$ and a barrier layer composed of Si-doped $In_{0.01}Ga_{0.99}N$ are repeated three times.

Next, the p-type second semiconductor layer 400 is formed over the active layer 300 (second semiconductor layer forming process). In the second semiconductor layer forming process, first, the p-type cap layer 420 is formed over the active layer 300. The p-type cap layer 420 grown herein is typically a Mg-doped, p-type $Al_{0.2}Ga_{0.8}N$ layer. Next, the p-type second optical confinement layer 440 is formed over the cap layer 420. The p-type second optical confinement layer 440 grown herein is typically a Mg-doped, p-type GaN layer. Next, the p-type second cladding layer 460 is formed over the second optical confinement layer 440. The p-type second cladding layer 460 formed herein is typically a p-type $Al_{0.1}Ga_{0.9}N$ layer. Next, the p-type contact layer 480 is formed over the second cladding layer 460. The p-type contact layer 480 grown herein is typically a Mg-doped, p-type GaN layer.

Figure 4:
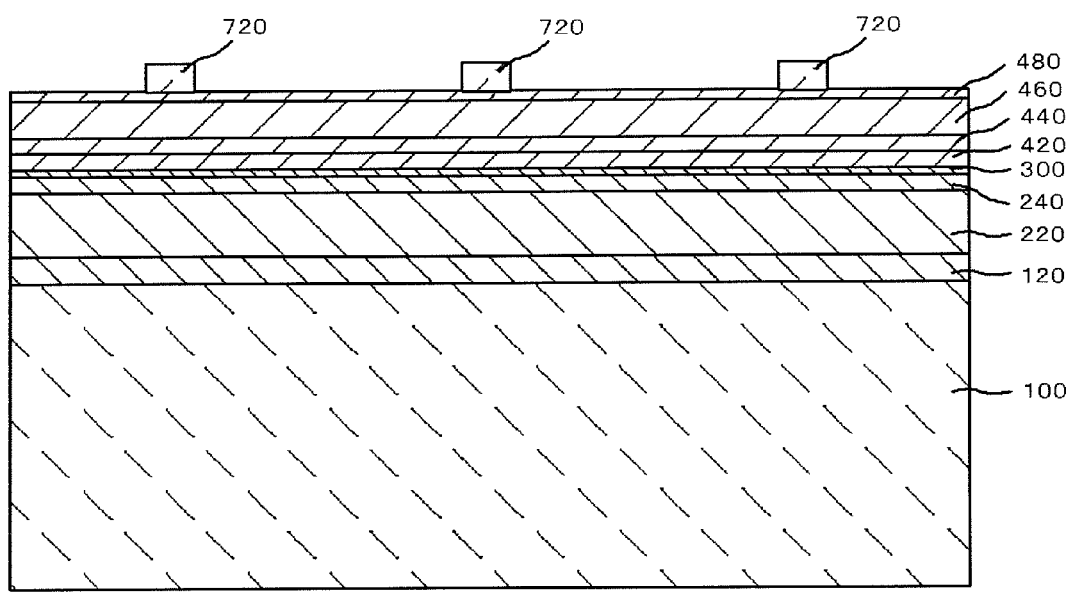

Next, a first mask layer 720 is formed, by sputtering, over the contact layer 480 as illustrated in FIG. 4. The first mask layer 720 formed herein is typically a $SiO_2$ layer. Next, a photoresist film (not illustrated) is formed over the first mask layer 720. The photoresist film is then patterned by exposure and development, such that the striped ridges 20 remain later. Next, the first mask layer 720 is patterned using RIE (reactive ion etching). Next, the photoresist film used as the mask is removed by wet cleaning or ashing.

Figure 5:
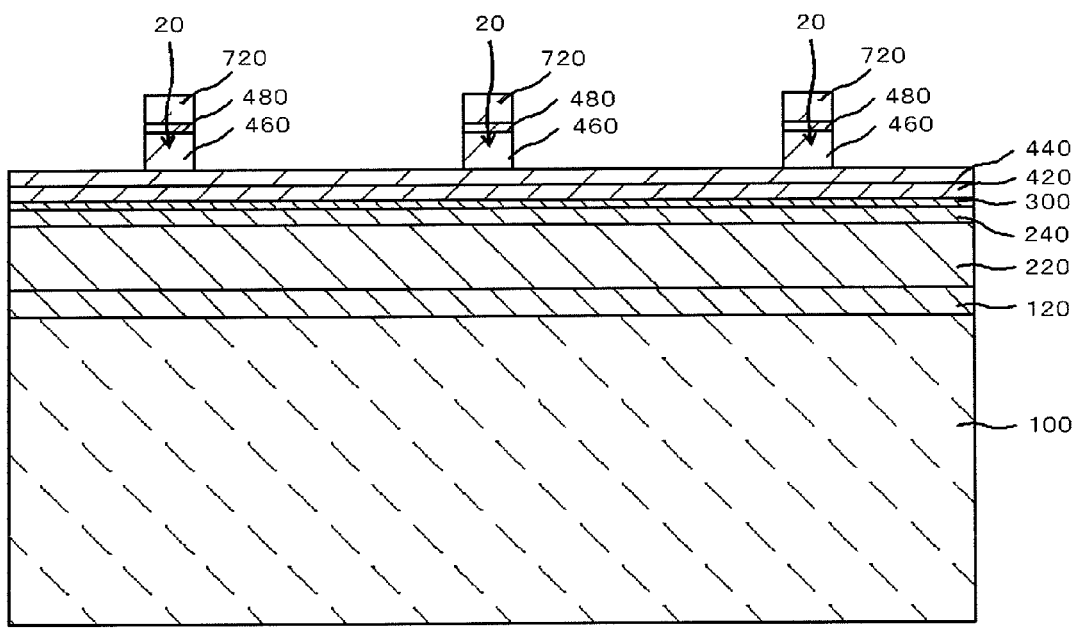

Next, as illustrated in FIG. 5, the contact layer 480 and the second cladding layer 460 are patterned by dry etching, using the first mask layer 720 as a mask. In this way, the second cladding layer 460 is patterned to give the striped ridges 20 extending in the direction normal to the cleavage planes. The striped ridges 20 are formed in the regions between the two adjacent trenches 820 formed later.

Figure 6:
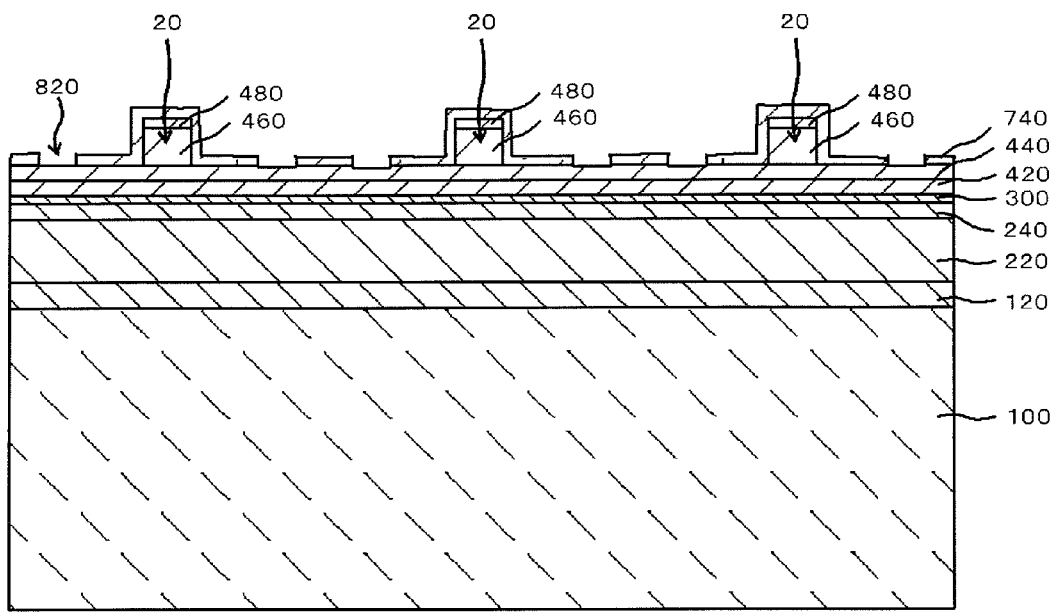

Next, the first mask layer 720 is removed, and a second mask layer 740 is formed over the second optical confinement layer 440 and the ridges 20 composed of the second cladding layer 460 and the contact layer 480. The second mask layer 740 is composed of $SiO_2$, for example. Next, a photoresist film (not illustrated) is formed over the second mask layer 740. The photoresist film is then subjected to exposure and development to define a pattern enabling removal of portions of the photoresist film under which the trenches 820 will be formed later in planar view. Next, the second mask layer 740 is patterned using RIE. The photoresist film used as the mask is then removed by wet cleaning or ashing, as illustrated in FIG. 6.

Figure 7:
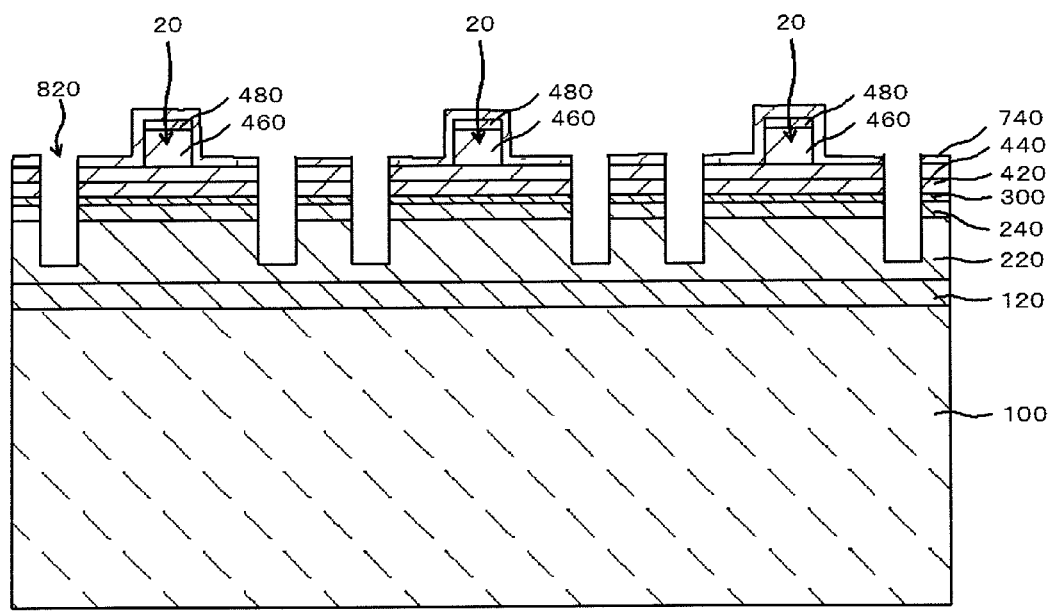

Next, as illustrated in FIG. 7, removal of portions of the second optical confinement layer 440, the cap layer 420, the active layer 300, the first optical confinement layer 240 and the first cladding layer 220 by dry etching using the second mask layer 740 as a mask leads to formation of the trenches 820 (trench forming process). Thus, the trenches 820 are formed such that their bottoms are positioned in the first cladding layer 220. Since the trenches 820 are etched into the relatively-thick first cladding layer 220, the trenches 820 may be formed in a highly reproducible and stable manner.

Figure 8:
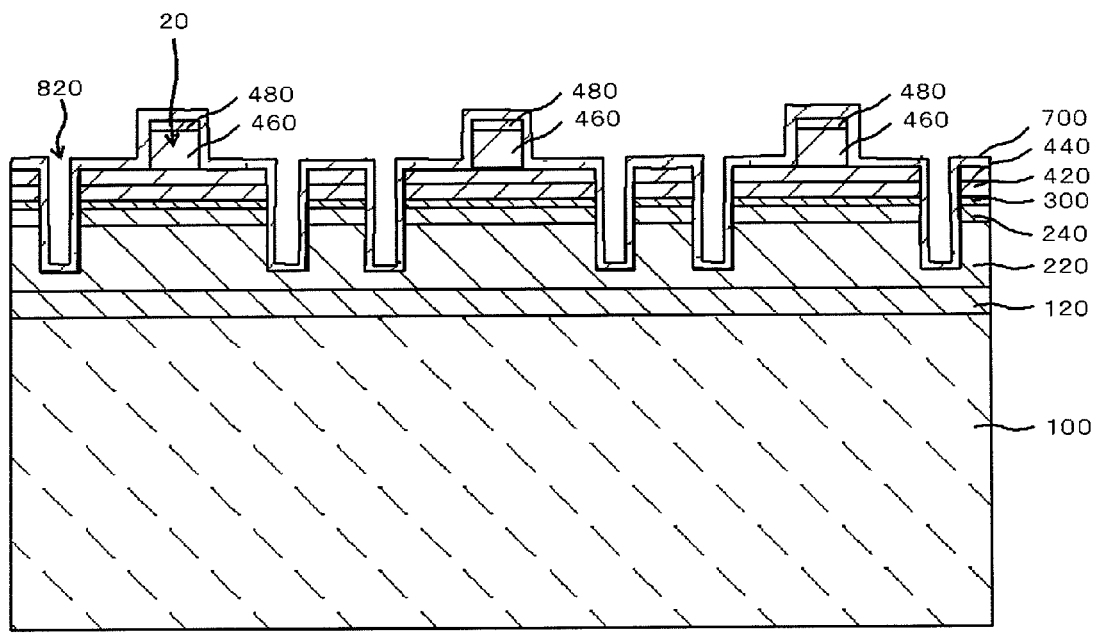

Next, as illustrated in FIG. 8, the second mask layer 740 used as the mask is removed using RIE. Next, the protective layer 700 is formed over the bottom portions and side faces of the trenches 820, the top surface of the second optical confinement layer 440, and the ridges 20 composed of the second cladding layer 460 and the contact layer 480. The protective layer 700 is composed of $SiO_2$, for example.

Figure 9:
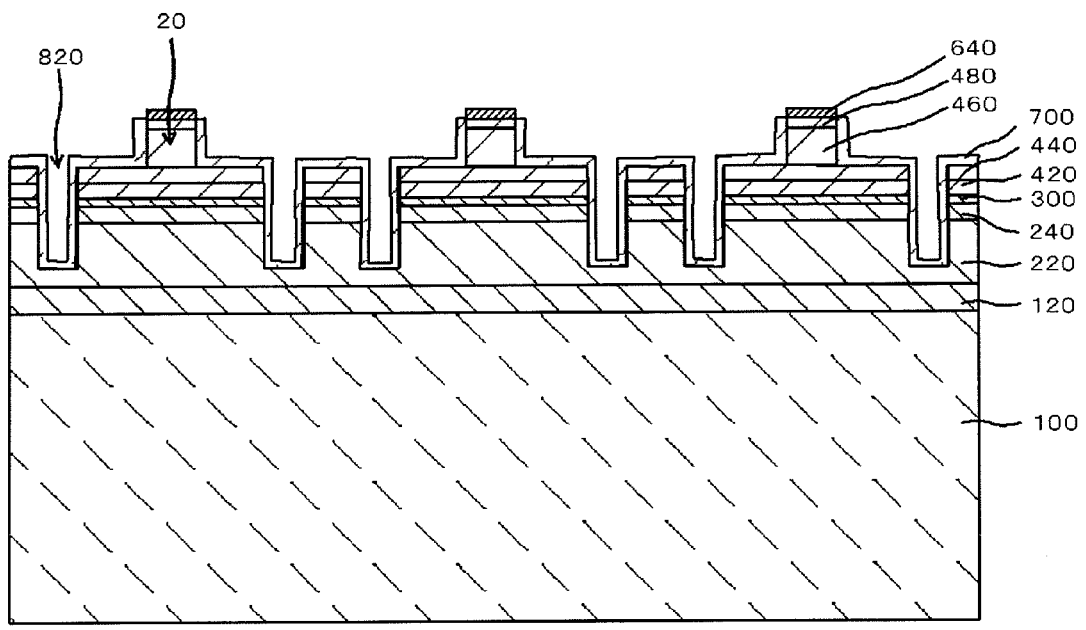

Next, a photoresist film (not illustrated) is formed over the protective layer 700. Next, the photoresist film is subjected to exposure and development to define a pattern enabling exposure of at least a part of the protective layer 700 on the contact layer 480. The exposed portion of the protective layer 700 is then removed by wet etching, as illustrated in FIG. 9. The photoresist film is removed.

Next, a photoresist film (not illustrated) is formed over the protective layer 700. The photoresist film is subjected to exposure and development to define a pattern enabling exposure of the opening of the protective layer 700. The second electrode 640 is formed on the protective layer 700 and the photoresist film by electron beam evaporation, for example, and is composed of Pd/Pt, for example. The photoresist film is then removed, along with a portion of the Pd/Pt film above it, by wet cleaning, for example (lift-off process), thus leaving the second electrode 640 only on the contact layer 480.

Figure 10:
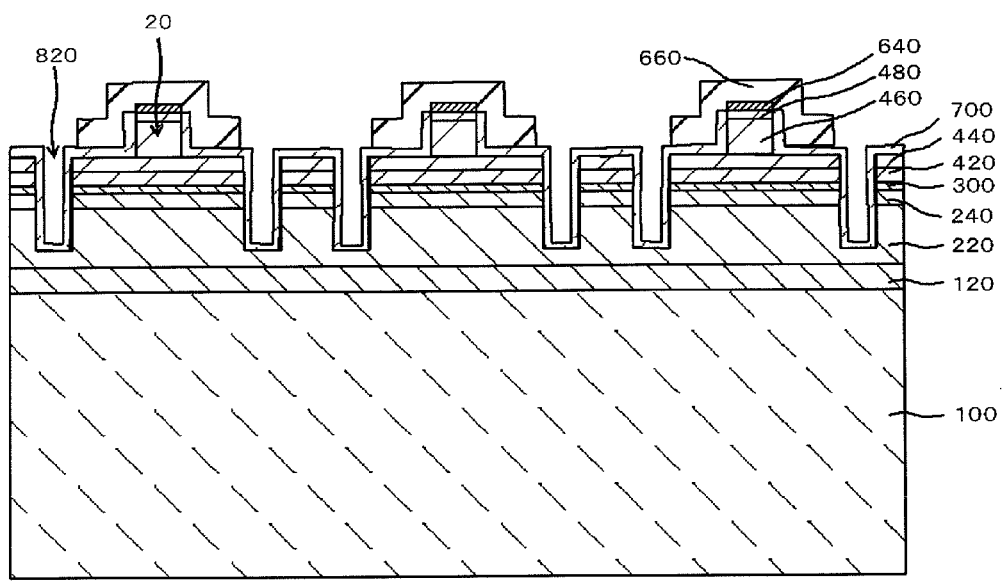

Next, as illustrated in FIG. 10, a film for composing the cover electrode 660 is formed over the protective layer 700, the second electrodes 640 and the ridges 20. The cover electrode 660 is formed, for example, by sputtering in the order of Ti/Pt/Au. Next, a photoresist film (not illustrated) is formed over a part of the film for composing the cover electrode 660. Next, the photoresist film is subjected to exposure and development to define a pattern, to thereby leave at least portions of the film above the cover electrode 660 disposed over the second electrode 640. Next, the cover electrode 660 is patterned by ion milling. Next, the photoresist film used as the mask is removed by wet cleaning, ashing, or the like. The cover electrode 660 is formed in this way.

Figure 11:
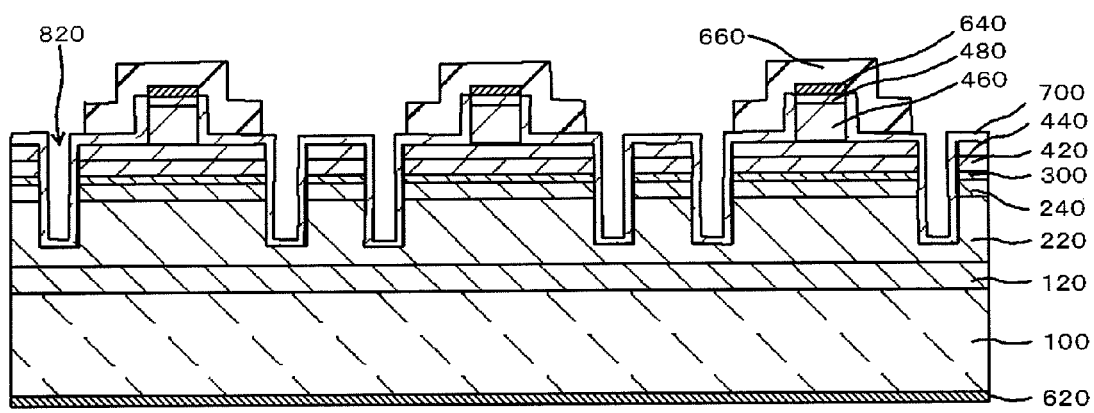

Next, the back surface of the substrate 100 is polished as illustrated in FIG. 11. The first electrode 620 is formed over the polished back surface of the substrate 100. The first electrode 620 herein is formed typically by sputtering in the order of Ti/Al/Ti/Au from the substrate 100.

Next, laser scribing is carried out. Laser used herein for the scribing is any of those having band gap energies larger than that of GaN (3.4 eV), available in the wavelength range of 266 nm or larger and 355 nm or smaller, for example. Lasers having such wavelength range are obtainable from third or fourth harmonic wave of solid state laser such as YAG and $YVO_4$ ($\lambda$=1064 nm). Irradiation energy of laser is typically 1 J/cm$^2$ or larger and 1000 J/cm$^2$ or smaller. A laser scribing apparatus adoptable to the process is configured such that a localized beam on the surface of the substrate 100 is traced with the aid of a galvano mirror or a moving stage on which the substrate 100 is placed.

Figure 12:
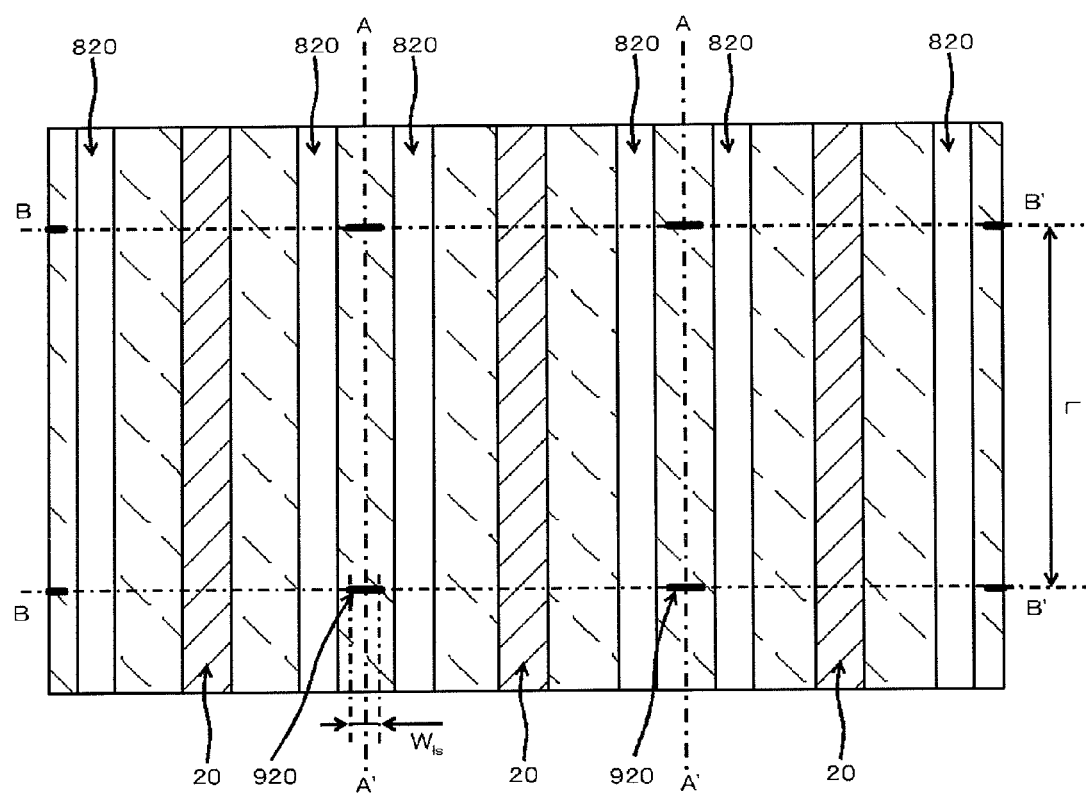
FIGS. 12 and 13 are plan views explaining the method of manufacturing a semiconductor light emitting device of the first embodiment.

The laser scribing leads to formation of cleavage inducing lines 920 in the direction parallel to the cleavage planes composing the first end faces 840 and in a region between the two adjacent trenches 820, as illustrated in FIG. 12. The "cleavage inducing line 920" herein means a straight-lined processed area formed by laser scribing, aimed at assisting formation of the first end faces 840, which are the cleavage planes. Each cleavage inducing line 920 is formed of the melt semiconductor layer by laser energy, similarly to break lines 940 described later. The distance between the adjacent cleavage inducing lines 920 in the longitudinal direction of the ridges 20 is set equal to the resonator length L, since the first end faces 840 are formed along the cleavage inducing lines 920. The direction parallel to the cleavage planes, along which the cleavage inducing lines 920 are formed, is typically the <11-20> direction.

The area expressed by "the area between the two adjacent trenches 820" is categorized into two areas. The area concerned herein is the area in which an emission area is not formed and the second end face 860 is to be formed. The emission area is determined by the ridge 20 as described in the above. Accordingly, the cleavage inducing lines 920 herein are formed in the region in which ridges 20 are not formed.

The width of each cleavage inducing line 920 is typically 1 μm or larger and 10 μm or smaller. For the length $W_{ls}$ of the cleavage inducing line 920, the cleavage inducing line 920 preferably does not reach the trench 820, that is, $W_{ls} < 2W_2$ is preferably satisfied. In addition, the relation $W_{ls} \geq 0.3W_p$ is preferably satisfied. If the cleavage inducing lines 920 is formed in this way, the first end faces 840, which are the cleavage planes, may be formed in a stable manner.

The depth $D_{ls1}$ of the cleavage inducing lines 920 is typically 10% or larger and 50% or smaller of the total thickness t of the semiconductor device 10. The depth $D_{ls1}$ falls within the above-described range by adjustment of conditions such as irradiation energy of laser. In this way, the first end faces 840, which are the cleavage planes, may be formed in a stable manner.

Next, as illustrated in FIG. 12, the substrate 100 is broken along lines B-B' to which the longitudinal direction of the cleavage inducing lines 920 is aligned. Thus, the first end faces 840 may be formed as the cleavage planes which appear on the B-B' cross section (first end face forming process).

After the first end face forming process, a low reflective film (not illustrated) may be formed on one of the first end faces 840. A high reflective film (not illustrated) may be formed on the other one of the first end faces 840. More specifically, the low reflective film is composed of $Al_2O_3$, for example, while the high reflective film is composed of a multi-layered film of $SiO_2$ and $ZrO_2$, for example.

Next, the second end face forming process is carried out as described below, after the above-described trench forming process, and also after the first end face forming process. Since a GaN-based semiconductor device has a hexagonal crystal system, it is more difficult to break the device along a plane orthogonal to the crystal plane (forming of the second end faces 860) than along the crystal plane (the first end face forming process). Accordingly, the second end face forming process preferably comes after the first end face forming process. The laser scribing is carried out in the second end face forming process, after the trenches 820 have already been formed in the trench forming process. In this way, the thermal damage possibly induced by laser may be suppressed from propagating up to the emission area.

Next, as illustrated in FIG. 13, the break lines 940 are formed by laser scribing, in the direction orthogonal to the first end faces 840 and in the region between the two adjacent trenches 820. The direction orthogonal to the first end faces 840, along which the break lines 940 are formed, is typically the <1-100> direction.

The region herein, in which the break lines 940 are formed, is one of the two types of "the area between the two adjacent trenches 820", having the cleavage inducing lines 920 already formed therein. In other words, the break lines 940 herein are formed in the region in which the ridges 20 are not formed. The break lines 940 are preferably formed at the center of the area between the two adjacent trenches 820. In this way, the substrate 100 may be broken in a stable manner.

As illustrated in FIG. 13, the break lines 940 are formed by laser scribing such that the lines 940 do not reach the first end faces 840. Accordingly, the length $L_{ls}$ of each break line 940 is shorter than the resonator length L.

If the break lines 940 are formed such that the lines 940 reach the first end faces 840, debris can occur in the process of forming the break lines 940. The "debris" refers to a chip or scattered matter generated when the semiconductor, the protective film and so forth are melted or evaporated by laser. If the debris occurs and adheres on the first end faces 840, the semiconductor light emitting device 10 may have low emission performance. If the break lines 940 are formed such that to the lines 940 do not reach the first end faces 840 as described in the above, the debris may be prevented from adhering onto the first end faces 840 in the process of forming the break lines 940.

The distance $\Delta L_{ls}$ [$=(L-L_{ls})/2$] between the end of the break line 940 and the first end face 840 meets $0 < \Delta L_{ls} \leq 20$ μm, for example. If $\Delta L_{ls} > 0$ is satisfied, the debris may be prevented from adhering onto the first end faces 840. If $\Delta L_{ls} \leq 20$ is satisfied, the substrate 100 may be successfully broken along break line 940, even along the region in which the break line 940 is not formed.

FIG. 14 is a cross sectional view taken along line C-C' in FIG. 13. As illustrated in FIG. 14, the break lines 940 are formed by laser scribing, from the top surface side of the protective layer 700.

The depth $D_{ls2}$ of the break lines 940 is typically 30% or larger and 70% or smaller of the total thickness t of the semiconductor device 10. The depth $D_{ls2}$ preferably reaches the substrate 100. The depth $D_{ls2}$ is falls within the above-described range by adjustment of conditions such as irradiation energy of laser, similarly to the process of forming the cleavage inducing lines 920. In this way, the second end faces 860, which are the cleavage planes, may be formed in a stable manner.

Next, the substrate 100 is broken along line A-A' to which the break lines 940 are aligned. In this way, the second end faces 860 are formed (second end face forming process).

Thereafter, the cover electrode 660 may be connected to a lead terminal (not illustrated) using a bonding wire (680, described later). The semiconductor light emitting device 10 may have a lidded cylindrical cap (not illustrated) that allows passage of light from the device 10 such that the cap covers the device 10. The semiconductor light emitting device 10 may be obtained in this way.

Figure 15A:
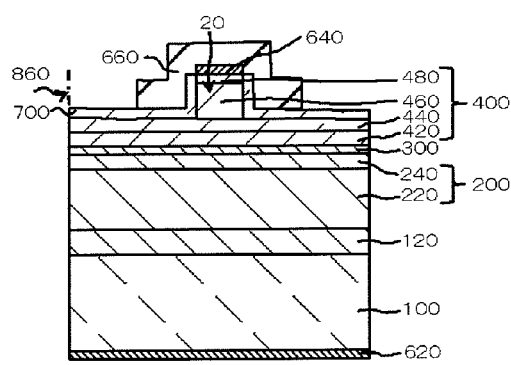
FIGS. 15A to 15D are drawings explaining effects of the first embodiment.
Figure 15B:
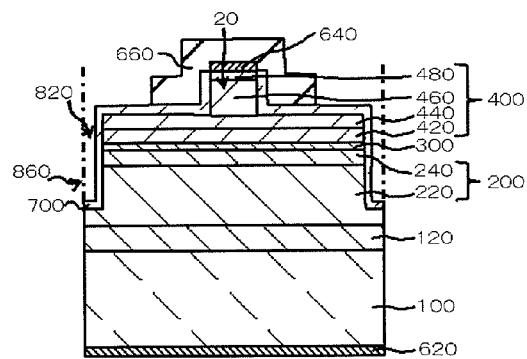
Figure 15C:
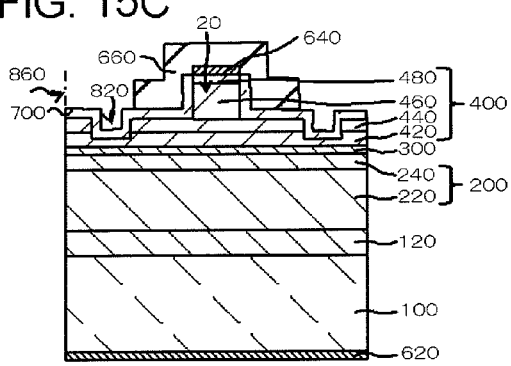
Figure 15D:
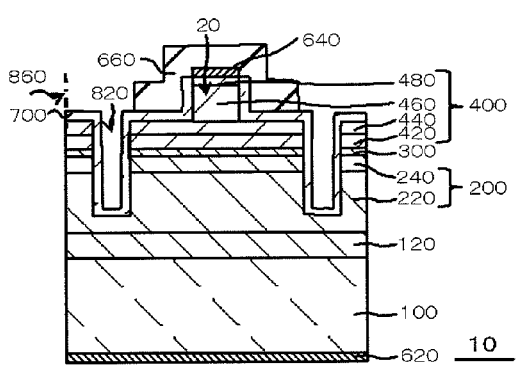

Next, effects of the first embodiment will be explained referring to FIGS. 15A to 15D and Related arts. FIGS. 15A to 15D are drawings explaining effects of the first embodiment. FIG. 15A illustrates a configuration of Related art 1, in which the trench 820 is not formed. FIG. 15B illustrates a configuration of Related art 2, in which the break lines 940 are formed in the trenches 820. FIG. 15C illustrates a configuration of Related art 3, in which the bottoms of the trenches 820 are formed above the active layer 300. FIG. 15D illustrates the semiconductor light emitting device 10 of the first embodiment similarly as illustrated in FIG. 1. In the description hereinafter, all aspects of Related arts 1 to 3 other than those described in the above are understood as the same with those of the first embodiment.

First, Related art 1, in which the trench 820 is not formed, will be discussed referring to FIG. 15A. In Related art 1, the laser scribing in the second end face forming process takes place in the absence of the trench 820. A melted portion of semiconductor (not illustrated) is formed on the second end face 860 having the break line 940. The melted portion is derived from melted constitutive elements of the semiconductor light emitting device 10, and exhibits conductivity. The melted portion can mediate between the first semiconductor layer 200 and the second semiconductor layer 400 having a different conductivity type from that of the layer 200, causing a short circuit between the layers 200 and 400, and the current leakage.

In Related art 1, the trench 820 is not formed between each second end face 860 in which the break line 940 is formed, and the emission area of the active layer 300. The laser-induced thermal damage may cause crystal defects such as dislocation, which may propagate to reach the emission area of the active layer 300 in the second end face forming process. As a result, the semiconductor light emitting device 10 may have a low emission performance.

Next, Related art 2, in which the break lines 940 are formed in the trenches 820, will be discussed referring to FIG. 15B. In Related art 2, the side faces of the trenches 820 and the break lines 940 are in such close proximity to each other that the laser beam may be scattered on the side faces of the trenches 820 in the second end face forming process. If the laser beam is scattered in this way, the laser beam cannot radiated on a target position and with a desired amount of energy. The radiation of the laser beam at a wrong position can cause the crack along the side faces of the trenches 820. In addition, the insufficient energy of laser beam can lead to formation of the shallow or thin break line 940.

In Related art 2, the laser beam may be radiated with the insufficient energy. One approach to deal with this problem would be to increase the laser energy to the desired level. An excessive increase in the energy of laser may, however, damage the side faces of the trenches 820, or may allow crystal defects induced by thermal damage to propagate to the emission area. The trenches 820 in Related art 2 must, therefore, have the wide width $W_g$, depending on accuracy and conditions of the laser scribing. This consequently limits the number of semiconductor light emitting devices 10 yielded from a single slice of substrate 100.

Next, Related art 3, in which the bottoms of the trenches 820 are positioned above the active layer 300, will be discussed referring to FIG. 15C. In Related art 3, the bottoms of the trenches 820 are positioned typically in the cap layer 420 of the second semiconductor layer 400 disposed above the active layer 300. Accordingly, the second semiconductor layer 400 extends continuously, in planar view, from the second end faces 860 towards the inside of the trenches 820. The melted portion of semiconductor may mediate between the first semiconductor layer 200 and the second semiconductor layer 400 having a different conductivity type from that of the layer 200, causing a short circuit between the layers 200 and 400, and the current leakage, similarly to Related art 1.

In Related art 3, the trench 820 to penetrate the active layer 300 is not formed between the emission area in the active layer 300 and the second end faces 860 formed along the break lines 940. Accordingly, similarly to Related art 1, the laser causes the thermal damage to induce the crystal defects, which may propagate to the emission area of the active layer 300 in the second end face forming process. In this case, the semiconductor light emitting device 10 may have a low emission performance.

Now, the semiconductor light emitting device 10 of the first embodiment will be discussed referring to FIG. 15D. According to the first embodiment, the two trenches 820 extend, in planar view, in the direction orthogonal to the first end faces 840 and up to two first end faces 840. The bottoms of the trenches 820 extend at least below the lower surface of the active layer 300. Also in the first embodiment, the second end faces 860, in which the break line 940 is formed, has the melted portion of semiconductor. The melted portion in this case, however, is spaced apart from the second semiconductor layer 400 in the region between the two trenches 820 in planar view, because of the trenches 820. Such a configuration prevents current leakage between the first semiconductor layer 200 and the second semiconductor layer 400 having a different conductivity type from that of the layer 200.

The trenches 820 herein are formed between the emission area of the active layer 300 and the second end faces 860 formed along the break line 940. In such a configuration, the laser-induced thermal damage may be prevented from directly propagating to the emission area of the active layer 300 in the second end face forming process. The semiconductor light emitting device 10 may suppress the degradation of the emission performance.

Such trenches 820 physically suppress the laser-induced nonconformities. As a result, the width $W_p$ of the semiconductor light emitting device 10 may be less than those in Related arts 1 to 3, regardless of the laser scribing conditions.

As may be understood from the above, the first embodiment may provide the semiconductor light emitting device having a desired geometry, without nonconformities possibly induced by the laser scribing.

(Second Embodiment)

Figure 16A:
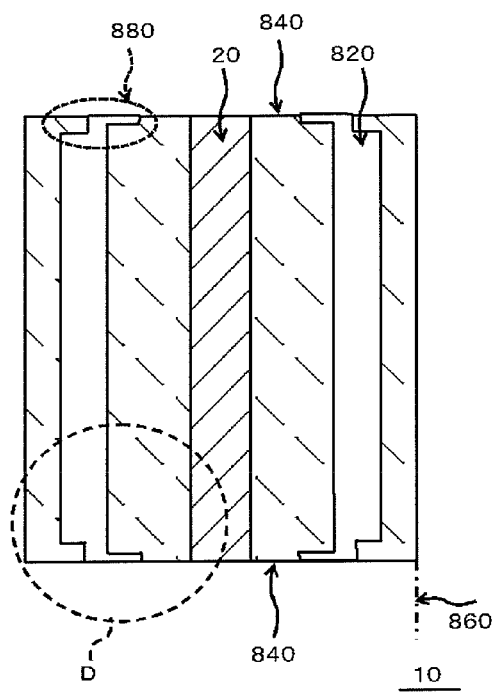
FIGS. 16A and 16B are plan views illustrating a configuration of a semiconductor light emitting device of a second embodiment.
Figure 16B:
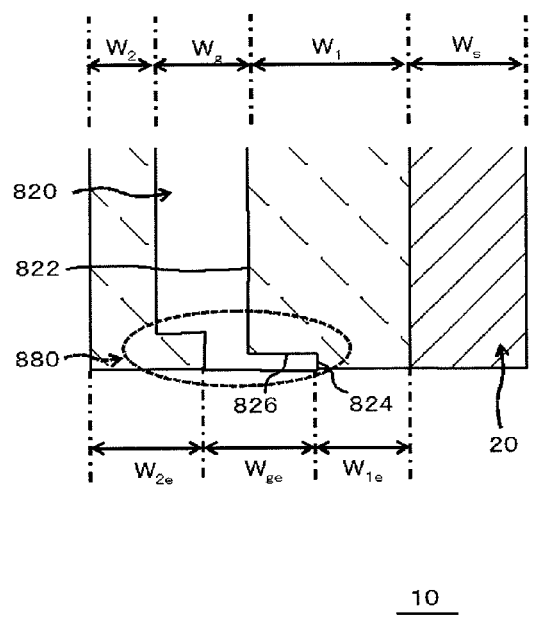

FIGS. 16A and 16B are plan views illustrating a configuration of a semiconductor light emitting device of a second embodiment. The second embodiment is similar to the first embodiment excepts for the aspects below. Each trench 820 has a first side face 822 extending, in planar view, from the center towards each first end face 840, and emission inhibition portions 880 bordering both first end faces 840. Each emission inhibition portion 880 has a second side face 824 bordering each first end face 840 and positioned closer than the first side face 822 relative to the ridge 20 composed of the second cladding layer 460, and a third side face 826 bordering the first side face 822 and the second side face 824. Details will be given below.

FIG. 16A illustrates a whole image of the semiconductor light emitting device 10 in planar view. As seen in FIG. 16A and similarly to the first embodiment, the first end faces 840 are formed by cleavage such that the faces 840 oppose each other in planar view. The two trenches 820 extend, in planar view, in the direction orthogonal to the first end faces 840 and up to the two first end faces 840. Each trench 820 has the emission inhibition portions 880 in a portion bordering the first end face 840.

The "emission inhibition portions 880" are formed to output the emission beam from the first end faces 840 in an appropriate shape. The emission inhibition portions 880 are typically portions of the trench 820 bordering the first end faces 840 and formed in a recess towards the ridge 20 in planar view.

Assume now that the "first side face 822" is a portion of the side face of the trench 820 positioned closer relative to the ridge 20 and extending in planar view from the center towards both first end faces 840. The first side face 822 extends in planar view from the center towards the emission inhibition portions 880.

FIG. 16B is an enlarged view illustrating area D in FIG. 16A. As seen in FIG. 16B, each emission inhibition portion 880 has a second side face 824 bordering each first end face 840 and positioned closer than the first side face 822 relative to the ridge 20 composed of the second cladding layer 460, and the third side face 826 bordering the first side face 822 and the second side face 824.

Each second side face 824 is formed typically in the direction orthogonal to each first end face 840. Each third side face 826 is in parallel with each first end face 840. This configuration may successfully guide the cleavage in cooperation with the cleavage inducing line 920, in the process of first end face forming process, and may improve the positional accuracy of cleavage.

Assume that, in one region bordering each first end face 840, $W_{2e}$ is the distance between the second end face 860 and the trench 820, $W_{ge}$ is the distance between the side face of the trench 820 on the side of the second end face 860 and the second side face 824, and $W_{1e}$ is the distance between the second side face 824 and the ridge 20. Note that the symbols ($W_2$, $W_g$ and $W_{1e}$) denoting the dimensions from the first end faces 840 to the center portion of the device are similar to those used in the first embodiment.

In the area bordering the first end face 840, the side face of the trench 820 formed near the second end face 860 preferably projects towards the ridge 20. In other words, the relation $W_{2e} > W_2$ is preferably satisfied. In this case, the cleavage inducing lines 920 may have a long line $W_{ls}$. If the length $W_{ls}$ of the cleavage inducing line 920 may be sufficiently large, the side face of the trench 820 formed near the second end face 860 may be formed such that the trench 820 straightly extends from the center portion of the device towards the first end faces 840, that is, the relation $W_{2e} = W_2$ may hold.

As described in the above, the second side faces 824 are positioned closer than the first side face 822 relative to the ridge 20, that is, the relation $W_{1e} < W_1$ holds. In such a configuration, the light escaping from the waveguide through the ridge 20 (unguided light) may be prevented from being output from the end face.

More specifically, the distance $W_{1e}$ between the second side face 824 and the ridge 20 is typically 20 µm or shorter, and preferably 5 µm or shorter. If $W_{1e}$ falls within the above-described ranges, the unguided and guided light may be prevented from interfering with each other and deforming the beam shape.

Each second side face 824 has a length of 5 µm or larger and 10 µm or smaller from the first end face 840. This configuration allows stable guidance of cleavage.

Figure 17:
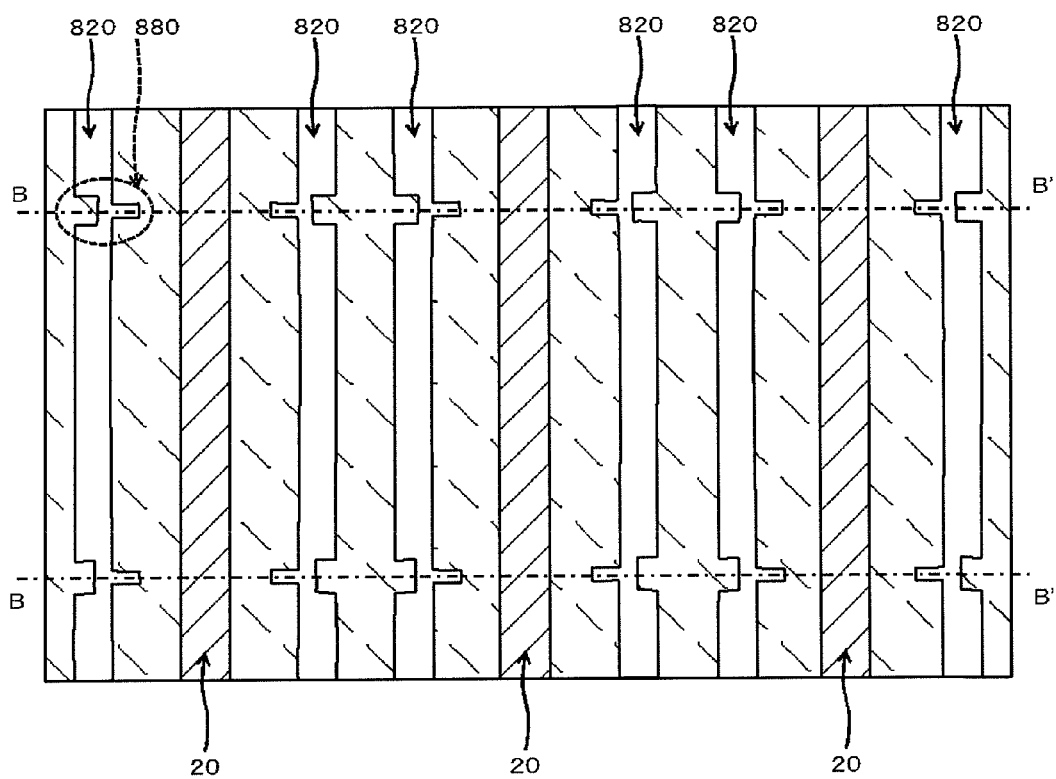
FIGS. 17 to 19 are plan views explaining a method of manufacturing a semiconductor light emitting device of the second embodiment.
Figure 18:
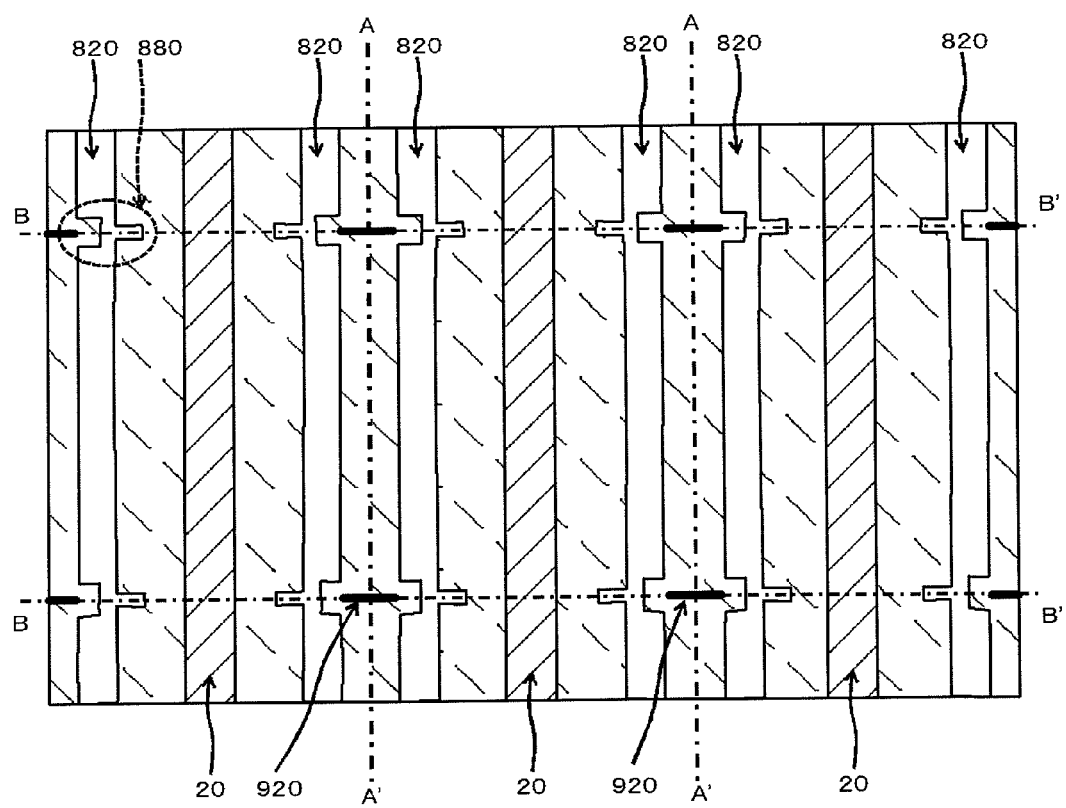
Figure 19:
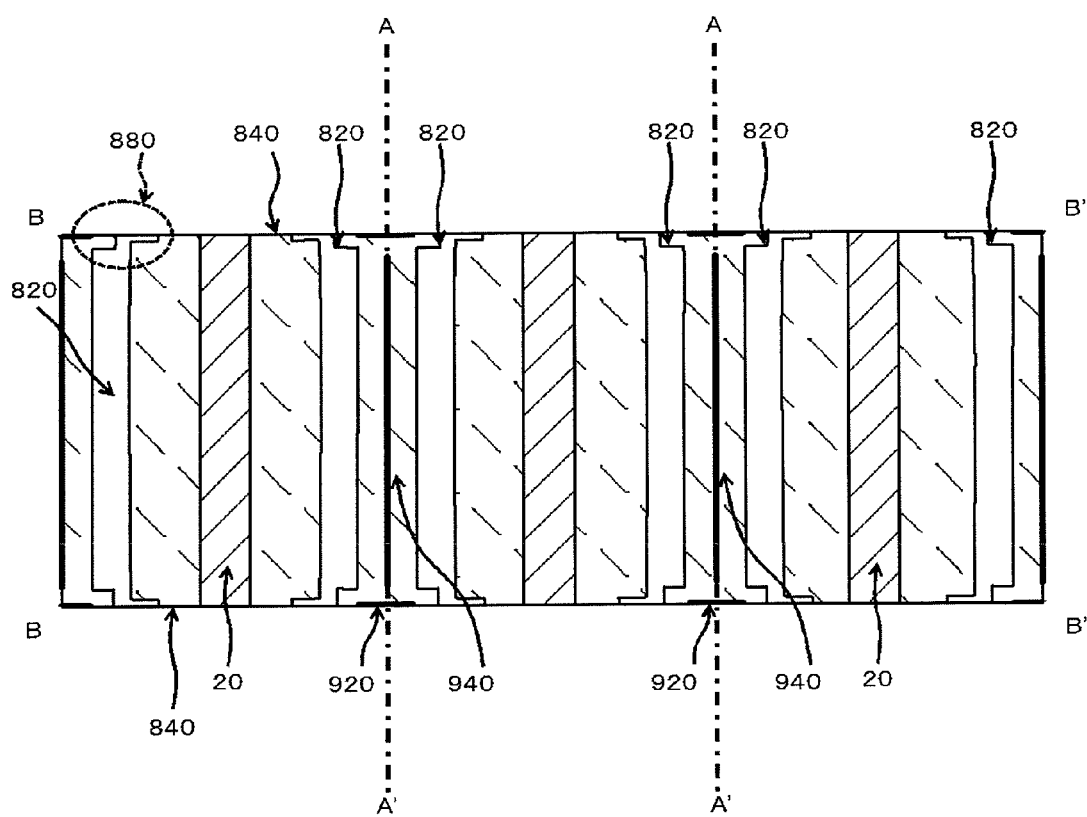

Next, a method of manufacturing of the semiconductor light emitting device 10 of the second embodiment will be explained, referring to FIG. 17 to FIG. 19. FIG. 17 to FIG. 19 are plan views for explaining the method of manufacturing the semiconductor light emitting device 10 of the second embodiment. The method of manufacturing of the semiconductor device 10 of the second embodiment is similar to that of the first embodiment, except for the aspects below. The trench forming process involves forming, in the trenches 820, the first side faces 822 extending from the center towards the cleavage planes in planar view, and the emission inhibition portions 880 bordering the cleavage planes in planar view. Details will be given below.

First, the processes are carried out similarly as described in the first embodiment, to thereby achieve the state illustrated in FIG. 5.

Next, the trench forming process is carried out as illustrated in FIG. 17. The emission inhibition portions 880 are formed in portions of the trenches 820 bordering the cleavage planes in planar view. In other words, the emission inhibition portions 880 are formed where the cleavage planes are formed as the first end faces 840 (positions indicated by lines B-B').

In order to form the emission inhibition portions 880, the second side faces 824 are formed to be positioned closer than the first side faces 822 relative to the ridges 20 composed of second cladding layers 460 such that the faces 824 overlap with the cleavage planes in planar view, while the third side faces 826 are formed to border the first side faces 822 and the second side faces 824.

In this process, the third side faces 826 are formed in parallel with the first end faces 840. In this way, the cleavage may be guided into the emission inhibition portion 880.

Next, the cleavage inducing lines 920 are formed by laser scribing as illustrated in FIG. 18. If the relation $W_{2e} > W_2$ holds in the emission inhibition portions 880 as described in the above, the cleavage inducing lines 920 may have long line $W_{ls}$. Note that the cleavage inducing lines 920 need not be formed if the emission inhibition portions 880 have a shape suitable for guided cleavage.

Next, the first end face forming process involves forming the first end faces 840 by cleavage as illustrated in FIG. 19. Next, the break lines 940 are formed by laser scribing. Processes thereafter are same as those in the first embodiment.

Next, effects of the second embodiment will be explained.

In the active layer 300 of the semiconductor light emitting device 10, light produced by recombination of electrons and holes is output from the first end faces 840. In this process, the holes injected from the second electrode 640 diffuse broadly from the ridge 20 in planar view, and recombine with the electrons in the active layer 300. Light is therefore output from the first end faces 840 while being spread wider than the width $W_s$ of the ridge 20.

According to the second embodiment, the trenches 820 have the emission inhibition portions 880 bordering the first end faces 840. Each emission inhibition portion 880 has a second side face 824 bordering each first end face 840 and positioned closer than the first side face 822 relative to the ridge 20 composed of the second cladding layer 460. Such a configuration can prevent the light from escaping from the second side face 824 towards the second end face 860, thus emitting the beam from the first end faces 840 in an appropriate manner.

(Third Embodiment)

Figure 20:
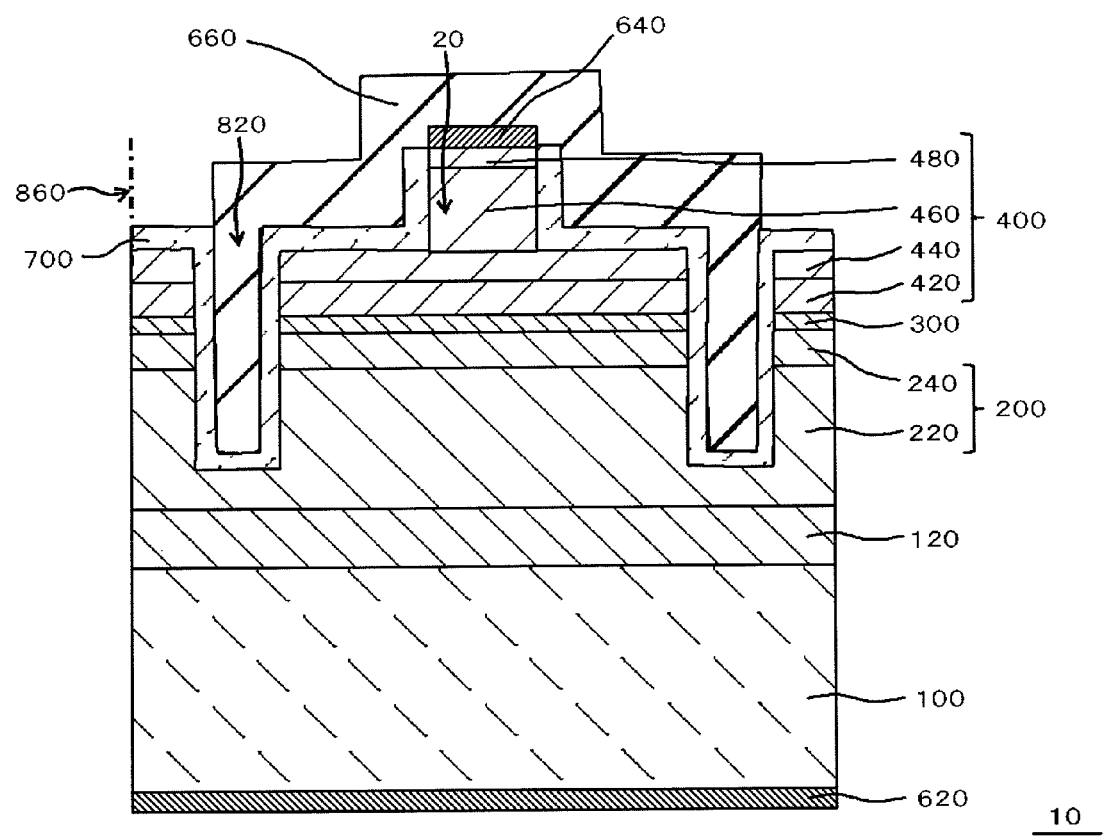
FIGS. 20 and 21 are cross sectional views illustrating a configuration of a semiconductor light emitting device of a third embodiment.
Figure 21:
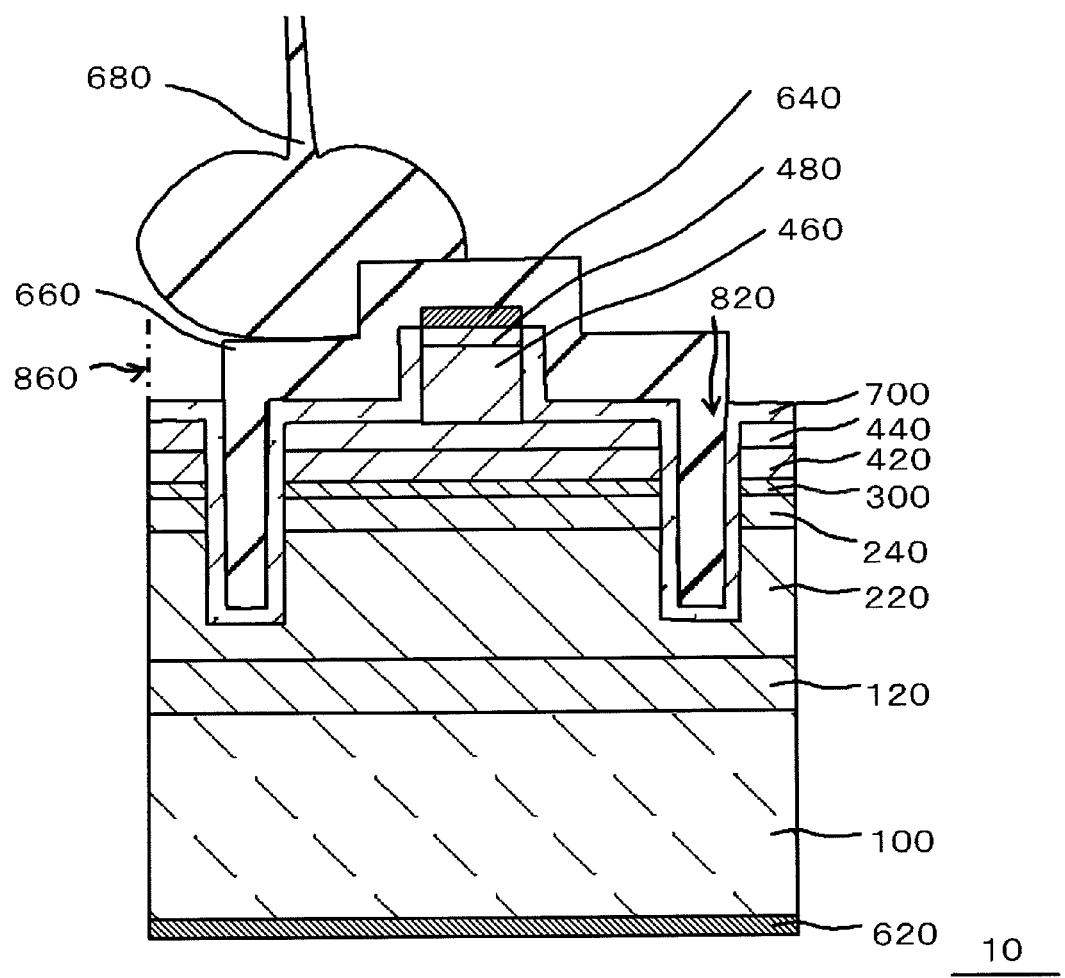

FIG. 20 and FIG. 21 are plan views illustrating a configuration of a semiconductor light emitting device 10 of a third embodiment. The third embodiment is similar to the first embodiment, except for the aspects below. The protective layer 700 herein is provided such that the layer 700 contacts with the second semiconductor layer 400 and inside of the trenches 820. The protective layer 700 has an opening (reference numeral not given) in a region between the two trenches 820 in planar view such that a portion of the second semiconductor layer 400 is exposed through the opening. The electrode (the second electrode 640 and the cover electrode 660) contacts with the above-described portion of the second semiconductor layer 400 exposed through the opening, and is provided on the protective layer 700. The electrode (cover electrode 660) is formed even inside the trenches 820. Details will be given below.

In the third embodiment, the "electrode" contains the second electrode 640 and the cover electrode 660. If the "electrode" may establish ohmic contact with both of the second semiconductor layer 400 and the bonding wire 680, either one of them will suffice.

In FIG. 20, the protective layer 700 is provided such that the layer 700 contacts with the second semiconductor layer 400 and inside the trenches 820. Such a configuration allows the cover electrode 660 to be isolated from the semiconductor layer in the trenches 820 in the third embodiment.

The protective layer 700 has the opening (reference numeral not given) in the region between the two trenches 820 in planar view such that a portion of the second semiconductor layer 400 is exposed through the opening. The second electrode 640 is formed such that the electrode 640 contacts with the second semiconductor layer 400 exposed through the opening.

The cover electrode 660 is provided above the second electrode 640 such that the electrode 660 covers the ridge 20. The cover electrode 660 is formed even inside the trenches 820. In other words, the cover electrode 660 has a portion overlapped with the trenches 820 in planar view. Accordingly, the cover electrode 660 in the third embodiment has a width greater than that in the first embodiment.

The cover electrode 660 may be formed in any range, provided that the electrode 660 is formed inside the second end faces 860. Such a configuration prevents the cover electrode 660 from inhibiting formation of the second end faces 860 in the second end face forming process.

In the exemplary case illustrated in FIG. 20, the trenches 820 are filled up by the cover electrode 660. It is sufficient to contact the cover electrode 660 with the bottom and the side faces of the trenches 820. The trenches 820 may not be fully filled up by the cover electrode 660. Alternatively, the cover electrode 660 may contact only with the side faces (the above-described first side faces 822) of the trenches 820.

FIG. 21 illustrates that the cover electrode 660 is connected to the bonding wire 680 for the connection with a lead terminal (not illustrated) or the like. The bonding wire 680 is typically bonded by ball bonding, as seen in FIG. 21. The bonding wire 680 is connected to a portion above the trench 820. In other words, the bonding wire 680 is connected to the cover electrode 660 at a position overlapping the trench 820 in planar view. In such a configuration, the impact of wire bonding does little harm to the crystallinity of the semiconductor light emitting device 10.

Effects of the third embodiment will be explained below.

The cover electrode 660 in the third embodiment is formed even inside the trenches 820. Accordingly, the bonding wire 680 may be reliably connected to the cover electrode 660. Since the bonding wire 680 may be connected above the trench 820, the impact of wire bonding does little harm to the crystallinity of the semiconductor light emitting device 10.

(Fourth Embodiment)

Figure 22:
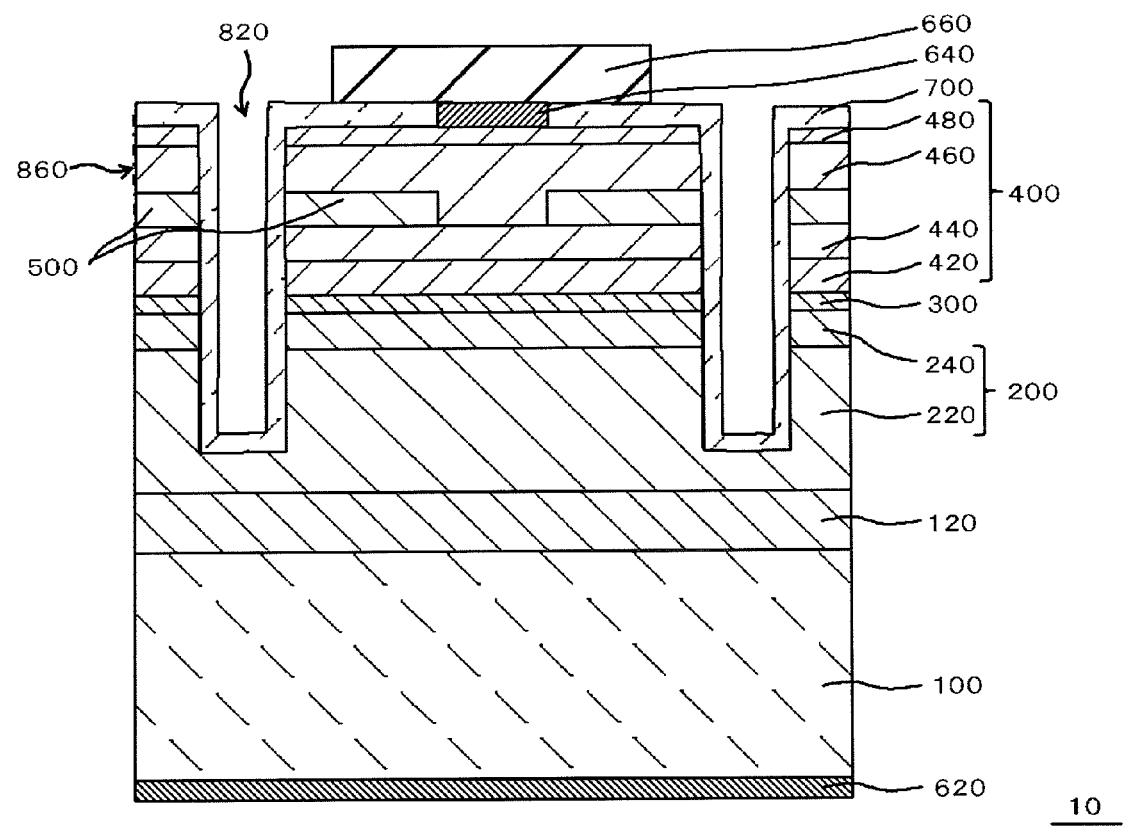
FIG. 22 is a cross sectional view illustrating a configuration of a semiconductor light emitting device of a fourth embodiment.

FIG. 22 is a plan view illustrating a configuration of the semiconductor light emitting device 10 of a fourth embodiment. The fourth embodiment is similar to the first embodiment, except that an inner stripe-type device is formed.

In FIG. 22, the semiconductor light emitting device 10 of the fourth embodiment has a structure, e.g. an inner stripe-type LD. The "inner stripe-type" herein means a structure having a current confinement layer 500, described later, embedded in the device, unlike the first embodiment based on the structure having the ridge 20. The configuration from the substrate 100 to the second optical confinement layer 440 in the second semiconductor layer 400 is same as that in the first embodiment.

The second optical confinement layer 440 is mounted by the current confinement layer 500 having an opening (reference numeral not given) at the center of the device. The current confinement layer 500 is typically composed of a semiconductor layer having a conductivity type opposite to that of the second semiconductor layer 400. More specifically, the current confinement layer 500 is typically composed of an n-type or undoped AlN layer.

The opening in the current confinement layer 500 is provided in order to concentrate the holes injected from the second electrode 640. The opening extends in the direction orthogonal to the first end faces 840 in planar view and up to the two first end faces 840.

The current confinement layer 500 is mounted by the second cladding layer 460 such that the layer 460 contacts with the second optical confinement layer 440 exposed through the opening. The second cladding layer 460 is mounted by the contact layer 480.

The two trenches 820 are provided outside the opening of the current confinement layer 500 in planar view. The bottoms of the trenches 820 extend below at least the lower surface of the active layer 300. In other words, the trenches 820 in the fourth embodiment penetrate the current confinement layer 500.

The protective layer 700 is provided on the contact layer 480 and inside the trenches 820. The protective layer 700 has an opening (reference numeral not given) in a region overlapping the opening of the current confinement layer 500 in planar view. The opening of the protective layer 700 preferably has a width larger than the width of the opening of the current confinement layer 500. A second electrode 640 is provided on the contact layer 480 exposed through the opening of the protective layer 700. The cover electrode 660 is provided on the second electrode 640.

According to the fourth embodiment, effects similar to those of the first embodiment may be obtained also by the inner stripe-type semiconductor light emitting device 10. The individual dimensions specified in the first embodiment may be applicable to the fourth embodiment, provided that the width $W_s$ of the ridge 20 in the first embodiment is placed with the width of opening of the current confinement layer 500.

(Fifth Embodiment)

Figure 23:
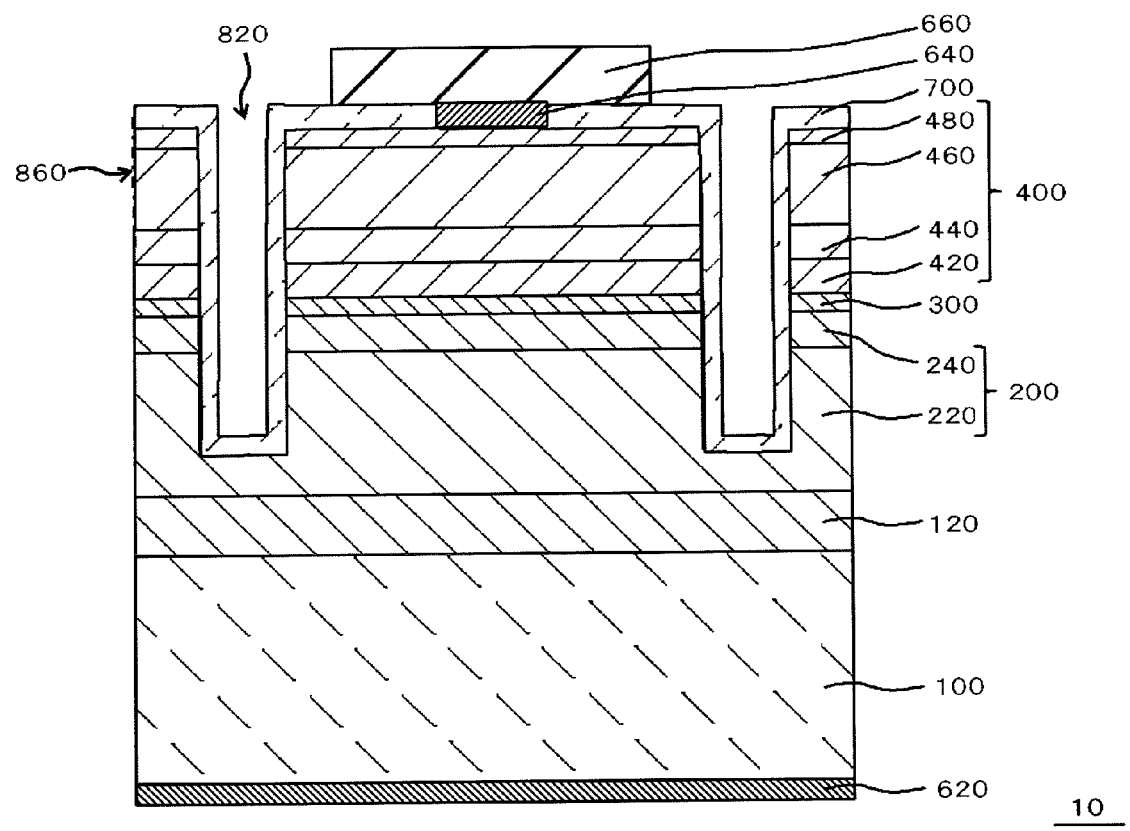
FIG. 23 is a cross sectional view illustrating a configuration of a semiconductor light emitting device of a fifth embodiment.

FIG. 23 is a plan view illustrating a configuration of a semiconductor light emitting device 10 of a fifth embodiment. The fifth embodiment is similar to the first embodiment or the fourth embodiment, except that the light emitting device is of gain-guided type. Details will be given below.

In FIG. 23, the semiconductor light emitting device 10 of the fifth embodiment has a structure, e.g. a gain-guided LED or LD. The "gain-guided" in this context means a structure having a stripe geometry of at least either one of carrier injecting layers, unlike the structure having the ridge 20 explained in the first embodiment. The fifth embodiment is similar to the fourth embodiment, except that the current confinement layer 500 is not provided.

Since there is neither ridge 20 nor current confinement layer 500, laser oscillation in the gain-guided structure needs large current density.

According to the semiconductor light emitting device 10 of the fifth embodiment, effects similar to those in the first embodiment are obtainable even with the gain-guided structure. The individual dimensions specified in the first embodiment may be applicable to the fourth embodiment, provided that the width $W_s$ of the ridge 20 in the first embodiment is placed with the width of opening of the protective layer 700.

EXAMPLES

Example 1

The semiconductor light emitting device 10 of Example 1 was manufactured similarly as described in the first embodiment. The substrate 100 used herein was an n-type GaN (0001) substrate. The individual semiconductor layers were formed in a reduced pressure MOVPE apparatus at 300 hPa. The individual materials used herein were similar to those described in the above.

The substrate 100 was placed in the MOVPE apparatus, and then heated under $NH_3$ flow. Upon reaching to the growth temperature, the growth was started with the Si-doped, n-type GaN layer 120 (Si concentration=$4\times10^{17}$ cm$^{-3}$, 1 μm thick).

Next, the n-type first cladding layer 220 composed of a Si-doped, n-type $Al_{0.1}Ga_{0.9}N$ layer (Si concentration=$4\times10^{17}$ cm$^{-3}$, 2 μm thick), and the n-type first optical confinement layer 240 composed of a Si-doped, n-type GaN layer (Si concentration=$4\times10^{17}$ cm$^{-3}$, 0.1 μm thick) were grown to form the first semiconductor layer 200.

Next, the active layer 300 having a three-period MQW structure of a well layer (3 nm thick) composed of $In_{0.15}Ga_{0.85}N$, and a barrier layer composed of Si-doped $In_{0.01}Ga_{0.99}N$ (Si concentration=$1\times10^{18}$ cm$^{-3}$, 4 nm thick), was grown.

Next, formation of the second semiconductor layer 400 was started with growth of the cap layer 420 composed of Mg-doped, p-type $Al_{0.2}Ga_{0.8}N$ (Mg concentration=$2\times10^{19}$ cm$^{-3}$, 10 nm thick). Next, the p-type second optical confinement layer 440 composed of Mg-doped, p-type GaN (Mg concentration=$2\times10^{19}$ cm$^{-3}$, 0.1 μm thick) was grown. Next, the p-type second cladding layer 460 composed of Mg-doped, p-type $Al_{0.1}Ga_{0.9}N$ (Mg concentration=$1\times10^{19}$ cm$^{-3}$, 0.5 μm thick) was grown. Next, the contact layer 480 composed of Mg-doped, p-type GaN (Mg concentration=$1\times10^{20}$ cm$^{-3}$, 20 nm thick) was grown.

The above-described GaN layers were grown at a substrate temperature of 1080° C., a TMG supply rate of 58 μmol/min, and a $NH_3$ supply rate of 0.36 mol/min.

The above-described AlGaN layers were grown at a substrate temperature of 1080° C., a TMA supply rate of 36 μmol/min, a TMG supply rate of 58 μmol/min, and a $NH_3$ supply rate of 0.36 mol/min.

The active layer 300 was grown at a substrate temperature of 800° C., a TMG supply rate 8 μmol/min, and a $NH_3$ supply rate of 0.36 mol/min. The TMI supply rate was adjusted to 48 μmol/min for the growth of the well layer, and 3 μmol/min for the growth of the barrier layer.

Next, the second cladding layer 460 and the contact layer 480 were patterned by dry etching to obtain the stripe-patterned ridges 20. Next, the trenches 820 were formed by RIE. Geometry of the trenches 820 will be described later.

Next, a $SiO_2$ layer was grown by sputtering to form the protective layer 700. Next, an opening was formed in the protective layer 700 above each ridge.

Next, a Pd/Pt film was formed on the ridge 20 by electron beam evaporation, and then annealed by RTA (rapid thermal annealing) in a nitrogen atmosphere at 600° C. for 30 seconds, to thereby form the second electrode 640.

Next, a Ti layer (50 nm), a Pt layer (100 nm) and an Au layer (2 μm) were formed in this order by sputtering, to thereby form the cover electrode 660. After the formation of the cover electrode 660, the back surface of the substrate 100 was polished to thin the substrate 100 down to 100 μm thick. Next, a Ti film (5 nm), an Al film (20 nm), a Ti film (10 nm), and an Au film (500 nm) were formed in this order by vacuum evaporation on the back surface of the substrate 100, to thereby form the first electrode 620.

Next, the cleavage inducing lines 920 were formed by laser scribing. Next, the first end faces 840 were formed by cleavage.

Next, a low reflective film composed of $Al_2O_3$ was formed on one of the first end faces 840. Next, a high reflective layer composed of a multi-layered film of $SiO_2$ and $ZrO_2$ was formed by ECR sputtering, on the opposite one of the first end faces 840. Values of reflectivity of the low reflective film and high reflective film were adjusted to 5% and 90%, respectively.

Next, the break lines 940 were formed by laser scribing. Next, the substrate 100 was broken along the break lines 940, to thereby manufacture the semiconductor light emitting devices 10.

The semiconductor light emitting device 10 of Example 1 has the dimensions below:
resonator length L=800 μm;
width $W_p$ of device=200 μm;
width $W_s$ of ridge 20=1.3 μm;
width $W_g$ of trench 820=54 μm;
distance $W_1$ between trench 820 and ridge 20=15.35 μm; and
distance $W_2$ between trench 820 and second end face 860=30 μm.

Example 2

Example 2 corresponds to the second embodiment. Configuration of the individual semiconductor layers is similar to that in Example 1, except that the trenches 820 have the emission inhibition portions 880. The semiconductor light emitting device 10 has the dimensions described below. The resonator length L, the width $W_p$ of device, and the width $W_s$ of ridge 20 are same as those in Example 1.

The trench 820 in Example 2 has the dimensions below:
width $W_g$ of center portion of trench 820=54 μm;
distance $W_1$ between first side face 822 and ridge 20=15.35 μm;
distance $W_{1e}$ between second side face 824 and ridge 20=3.35 μm;
distance $W_2$ between first side face 822 and second end face 860=30 μm; and
distance $W_{2e}$ between side face bordering first end face 840 and second end face 860=80 μm.

(Related Art 1)

Related art 1 is similar to Example 1, except that the trench 820 is not formed in Related art 1 similarly to Related art 1 previously mentioned in the first embodiment.

(Related Art 2)

In Related art 2, the break lines 940 were formed in the trenches 820, similarly to Related art 2 previously mentioned in the first embodiment. In Related art 2, the trench 820 has the dimensions below:
resonator length L=800 μm,
width $W_p$ of device=200 μm,
width $W_s$ of ridge 20=1.3 μm,
distance $W_1$ between trench 820 and ridge 20=45.35 μm.

(Results)

First, geometry of the semiconductor light emitting device 10 was observed under a scanning electron microscope (SEM).

In Related art 2, in which the break lines 940 were formed in the trenches 820, it was found that some of the second end faces 860 derailed from the break lines 940 and aligned rather along the side face of the side faces of the trenches 820 in a plurality of semiconductor light emitting devices 10. One possible cause is that the laser beam was scattered on the side faces of the trenches 820 in the second end face forming process.

In Examples 1 and 2, the first end faces 840 and the second end faces 860 were found to be formed in a desirable manner over the entire portion of the semiconductor device 10.

Next, light output-current characteristics (L-I), leakage current under reverse bias (Ir), and horizontal/vertical far-field patterns (FFP) of the thus-obtained semiconductor light emitting devices 10 were evaluated.

In Related art 1, in which the trench 820 is not formed, a distribution in the L-I characteristics was found. Irregularity in the FFP profile were found in a plurality of devices. Increase in Ir was observed.

In order to further investigate into causes for the nonconformities in Related art 1, the same substrate 100 was broken using a diamond scriber to thereby produce the semiconductor light emitting devices 10. Similar evaluation of the thus-obtained devices showed no increase in Ir. One possible cause for the current leakage in Related art 1 was, therefore, the laser scribing. That is, the laser scribing may have made the melted portion of semiconductor on the break lines 940. In addition, the width $W_p$ of device was as small as 200 μm while the distance between the cover electrode 660 and the break line 940 was small. Such a configuration may have promoted the nonconformities.

Also in Related art 2, a distribution in the L-I characteristics, irregularities in the FFP profile, and increase in Ir in some devices, were confirmed similarly to Related art 1. This may have been caused by irregularities in the geometry of the semiconductor device 10.

Examples 1 and 2 showed no increase in Ir, and showed desirable L-I characteristics. Example 2 showed a desirable FFP profile. In summary, Examples 1 and 2 showed no nonconformities caused by the laser scribing, and provided semiconductor light emitting devices 10 with desired geometries.

The embodiments of the present invention have been described in the above, merely as illustrative examples, without precluding use of other various configurations.

It is apparent that the present invention is not limited to the above embodiment, and may be modified and changed without departing from the scope and spirit of the invention.

The manufacturing method for the present invention may be summarized as follows:

(1) A method of manufacturing a semiconductor light emitting device composed of a Group III nitride semiconductor, the method comprising:
forming a first conductivity-type first semiconductor layer above a substrate;
forming an active layer over the first semiconductor layer;
forming a second conductivity-type second semiconductor layer over the active layer;
forming two trenches extending in a direction orthogonal to two cleavage lines in planar view, wherein bottoms of the trenches are positioned at least below the lower surface of the active layer;
forming first end faces by cleavage along the two cleavage lines, the first end faces being opposite each other in planar view; and
forming second end faces in a direction orthogonal to the first end faces and in regions between the two adjacent trenches, the second end faces being formed by laser scribing.

(2) The method of manufacturing a semiconductor light emitting device according to (1),
wherein the step of forming the second end face comes after the step of forming the trenches and the step of forming the first end face.

(3) The method of manufacturing a semiconductor light emitting device according to (2),
wherein the step of forming the second end face involves forming a break line by the laser scribing at a position inside each of the first end faces.

(4) The method of manufacturing a semiconductor light emitting device according to (1),
wherein the step of forming the first end faces involves forming a cleavage inducing line by the laser scribing in a direction in parallel with the cleavage lines and in a region between the two trenches in planar view.

(5) The method of manufacturing a semiconductor light emitting device according to (1),
wherein the step of forming the first semiconductor layer further comprises:
forming a first conductivity-type first cladding layer above the substrate; and
forming a first conductivity-type first optical confinement layer over the first cladding layer,
the active layer formed in the step of forming the active layer includes a multiple quantum well structure,
the step of forming the second semiconductor layer further comprises:
forming a second conductivity-type second optical confinement layer over the active layer; and
forming a second cladding layer over the second optical confinement layer.

(6) The method of manufacturing a semiconductor light emitting device according to (5),
wherein bottoms of the trenches formed in the step of forming the trenches are positioned in the first cladding layer.

(7) The method of manufacturing a semiconductor light emitting device according to (5),
wherein the step of forming the second semiconductor layer involves forming the second cladding layer in a region between the two trenches in planar view, wherein the second cladding layer is formed in a striped ridge pattern to extend towards the cleavage lines.

(8) The method of manufacturing a semiconductor light emitting device according to (7),
wherein the step of forming the trenches involves:
forming first side faces in the trenches, wherein the first side faces extends from a center of each of the trenches towards the cleavage lines in planar view; and
forming emission inhibition portions overlapping the cleavage lines in each of the trenches,
each of the emission inhibition portions comprises:
a second side face formed to overlap each of the cleavage lines in a planar view, the second side face being positioned closer than the first side face relative to the ridge composed of the second cladding layer; and
a third side face bordering the first side face and the second side face.

(9) The method of manufacturing a semiconductor light emitting device according to (8),
wherein the third side face is formed in parallel with each of the first end faces.

What is claimed is:

1. A semiconductor light emitting device composed of a Group III nitride semiconductor, comprising:
a substrate;
a first conductivity-type first semiconductor layer provided above the substrate;
an active layer provided over the first semiconductor layer;
a second conductivity-type second semiconductor layer provided over the active layer;
two first end faces formed by cleavage and opposite each other in planar view;
two trenches extending to the two first end faces in a direction orthogonal to the first end faces in planar view, wherein bottoms of the trenches are positioned at least below a lower surface of the active layer; and
second end faces formed in the direction orthogonal to the first end faces and outside the trenches, the second end faces being formed by laser scribing, wherein the first semis conductor layer comprises:
  a first conductivity-type first cladding layer provided above the substrate; and
  a first conductivity-type first optical confinement layer provided over the first cladding layer,
the active layer has a multiple quantum well structure,
the second semiconductor layer comprises:
  a second conductivity-type second optical confinement layer provided over the active layer; and
  a second conductivity-type second cladding layer provided over the second optical confinement layer, and
wherein the bottoms of the trenches are positioned in the first cladding layer.

2. The semiconductor light emitting device according to claim 1,
  wherein the substrate is a first conductivity-type GaN substrate.

3. The semiconductor light emitting device according to claim 1,
  wherein the second cladding layer is formed in a region between the two trenches in planar view, and formed in a striped ridge pattern to extend to the first end faces.

4. The semiconductor light emitting device according to claim 3,
  wherein a distance from each trench to the ridge composed of the second cladding layer is not smaller than a width of the ridge composed of the second cladding layer in planar view.

5. The semiconductor light emitting device according to claim 3,
  wherein an equation (2) below holds:

[Mathematical Formula 1]

$$W_g \leq 0.3 W_p - 1.5 W_s \quad (2)$$

where Wg is a width of the trench, Wp is a distance between the two second end faces, and Ws is a width of the ridge composed of the second cladding layer.

6. The semiconductor light emitting device according to claim 3,
  wherein each of the trenches includes:
    a first side face extending from a center towards each of the first end faces in planar view; and
    an emission inhibition portion bordering each of the first end faces, and the emission inhibition portion comprises:
      a second side face bordering each of the first end faces, the second side face being positioned closer than the first side face relative to the ridge composed of the second cladding layer; and
      a third side face bordering the first side face and the second side face.

7. The semiconductor light emitting device according to claim 6,
  wherein the third side face is in parallel with each of the first end faces.

8. The semiconductor light emitting device according to claim 6,
  wherein a distance between the second side face and each of the first end faces is greater than or equal to 5 μm and less than or equal to 10 μm.

9. The semiconductor light emitting device according to claim 1, further comprising:
  a protective layer formed to contact with a top surface of the second semiconductor layer and inner surfaces of the trenches, the protective layer having an opening formed in a region between the two trenches, wherein a part of the second semiconductor layer is exposed through the opening; and
  an electrode provided over the protective layer and contacting with the part of the second semiconductor layer exposed through the opening,
  wherein the electrode is disposed in the trenches.

10. The semiconductor light emitting device according to claim 1,
  wherein a depth of each of the trenches measured from the opening edge to its bottom is 10% or less of a total thickness of the device.

11. The semiconductor light emitting device according to claim 1,
  wherein the total thickness is 80% or less of a distance between the two first end faces in planar view.

12. The semiconductor light emitting device according to claim 1,
  wherein the total thickness is 80% or less of a distance between the two second end faces in planar view.

13. The semiconductor light emitting device according to claim 1,
  wherein a width of each of the trenches is 1 μm or larger.

14. The semiconductor light emitting device according to claim 1,
  wherein $W2 \geq 0.2 Wp$ is satisfied, where Wp is a distance between the two second end faces, and W2 is a distance between the second end face and each of the trenches.

* * * * *